United States Patent
Koike

(10) Patent No.: US 10,707,335 B2
(45) Date of Patent: Jul. 7, 2020

(54) MAGNETORESISTANCE EFFECT ELEMENT, MAGNETIC SENSOR AND SPIN TRANSISTOR

(71) Applicant: TDK CORPORATION, Tokyo (JP)

(72) Inventor: Hayato Koike, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/356,424

(22) Filed: Mar. 18, 2019

(65) Prior Publication Data
US 2019/0305118 A1    Oct. 3, 2019

(30) Foreign Application Priority Data
Mar. 30, 2018    (JP) .................................. 2018-067658

(51) Int. Cl.
| | |
|---|---|
| G01R 33/09 | (2006.01) |
| H01L 29/66 | (2006.01) |
| H01L 29/82 | (2006.01) |
| H01L 29/45 | (2006.01) |
| H01L 29/78 | (2006.01) |
| H01L 29/04 | (2006.01) |

(52) U.S. Cl.
CPC ...... *H01L 29/66984* (2013.01); *G01R 33/093* (2013.01); *H01L 29/045* (2013.01); *H01L 29/45* (2013.01); *H01L 29/78* (2013.01); *H01L 29/82* (2013.01)

(58) Field of Classification Search
CPC ..... H01L 29/045; H01L 29/82; G01R 33/093; G01R 33/0052; G01R 33/098; H01P 1/11; H01P 1/19; H01P 1/23; H01P 1/217; H01F 41/046; H01F 10/3272; H03C 7/022
See application file for complete search history.

(56) References Cited

U.S. PATENT DOCUMENTS

| | | |
|---|---|---|
| 2010/0314702 A1 | 12/2010 | Sasaki et al. |
| 2016/0284982 A1 | 9/2016 | Sasaki et al. |

FOREIGN PATENT DOCUMENTS

| | | |
|---|---|---|
| JP | 2010-287666 A | 12/2010 |
| WO | 2015/076187 A1 | 5/2015 |

*Primary Examiner* — Hsien Ming Lee
(74) *Attorney, Agent, or Firm* — Oliff PLC

(57) ABSTRACT

The magnetoresistance effect element includes a semiconductor layer, a first ferromagnetic layer and a second ferromagnetic layer. The semiconductor layer has a first region, a second region, and a third region. The first ferromagnetic layer is provided on the first region, the second ferromagnetic layer is provided on the second region, and the third region is sandwiched between the first region and the second region in the first direction. The third region has n-type conductivity, and crystal orientations of the semiconductor material in the direction are substantially the same in the first region, the second region, and the third region. An interatomic distance of the third region in an upper surface neighboring region is larger than an interatomic distance of the third region in a lower surface neighboring region.

26 Claims, 13 Drawing Sheets

MAGNETORESISTANCE EFFECT ELEMENT, MAGNETIC SENSOR AND SPIN TRANSISTOR

TECHNICAL FIELD

The present disclosure relates to a magnetoresistance effect element, a magnetic sensor and a spin transistor.

BACKGROUND

A magnetoresistance effect element having a ferromagnetic layer as a magnetization free layer, a nonmagnetic spacer layer, and a ferromagnetic layer as a magnetization fixed layer, such as a giant magnetoresistance (GMR) effect element and a tunnel magnetoresistance (TMR) effect element, are known. Such a magnetoresistance effect element is used in a device such as a magnetic sensor, a magnetic head, and a magnetoresistance random access memory (MRAM).

Magnetoresistance effect elements currently in practical use have a configuration in which a magnetization free layer, a nonmagnetic spacer layer, and a magnetization fixed layer are stacked in this order. However, in recent years, magnetoresistance effect elements having a configuration in which a magnetization free layer and a magnetization fixed layer are provided on an upper surface of a channel layer composed of a nonmagnetic material have received attention (for example, Patent Document 1 (Japanese Unexamined Patent Application Publication No. 2010-287666) and Patent Document 2 (WO 2015/076187)). In the magnetoresistance effect elements described in Patent Document 1 and Patent Document 2, the magnetization free layer and the magnetization fixed layer are formed on substantially the same plane, spin-polarized electrons injected from the magnetization free layer or the magnetization fixed layer into the channel layer transport or diffuse in the channel layer, and spins accumulate in the channel layer. According to the magnetoresistance effect element having such a configuration, it is expected that a high spatial resolution will be able to be obtained when it is applied to a magnetic sensor such as a magnetic head or the like on the basis of structural differences from a conventional magnetoresistance effect element, and it is also expected that a degree of freedom in a device design can be improved when it is applied to a device.

SUMMARY

In the magnetoresistance effect element as described above, one of the elements necessary for improving a signal-to-noise ratio (a SN ratio) is to increase a spin diffusion length and a spin lifetime when spin-polarized carriers (electrons or holes) transport or diffuse in the channel layer. From such a viewpoint, in the magnetoresistance effect elements described in the above-mentioned Patent Documents 1 and 2, the channel layer is generally constituted by a semiconductor material having a spin diffusion length and a spin lifetime longer than those of a metallic material.

However, even with such a configuration, the SN ratio of the magnetoresistance effect element as described above does not reach a level required for device application.

It is desirable to provide a magnetoresistance effect element capable of obtaining a larger SN ratio than a conventional one, and a magnetic sensor and a spin transistor using such a magnetoresistance effect element.

A magnetoresistance effect element according to an aspect of the present disclosure includes a semiconductor layer, a first ferromagnetic layer and a second ferromagnetic layer. The first ferromagnetic layer and the second ferromagnetic layer are provided on an upper surface of the semiconductor layer to be spaced apart from each other in a first direction. The semiconductor layer has a first region, a second region and a third region each of which includes a part of the upper surface of the semiconductor layer and a part of a lower surface of the semiconductor layer and contains the same semiconductor material as a base material. The first ferromagnetic layer is provided on the first region, the second ferromagnetic layer is provided on the second region. The third region is sandwiched between the first region and the second region in the first direction. The third region has n-type conductivity. Crystal orientations of the semiconductor material in the first direction are substantially the same in the first region, the second region, and the third region. An interatomic distance of the third region in the crystal orientation of the semiconductor material in the first direction in an upper surface neighboring region including the upper surface is larger than an interatomic distance of the third region in the crystal orientation of the semiconductor material in the first direction in a lower surface neighboring region including the lower surface.

Further, a magnetoresistance effect element according to another aspect of the present disclosure includes a semiconductor layer, a first ferromagnetic layer and a second ferromagnetic layer. The first ferromagnetic layer and the second ferromagnetic layer are provided on an upper surface of the semiconductor layer to be spaced apart from each other in a first direction. The semiconductor layer has a first region, a second region and a third region each of which includes a part of the upper surface of the semiconductor layer and a part of a lower surface of the semiconductor layer and contains the same semiconductor material as a base material. The first ferromagnetic layer is provided on the first region, the second ferromagnetic layer is provided on the second region. The third region is sandwiched between the first region and the second region in the first direction. The third region has p-type conductivity. Crystal orientations of the semiconductor material in the first direction are substantially the same in the first region, the second region, and the third region. An interatomic distance of the third region in the crystal orientation of the semiconductor material in the first direction in an upper surface neighboring region including the upper surface is smaller than an interatomic distance of the third region in the crystal orientation of the semiconductor material in the first direction in a lower surface neighboring region including the lower surface.

Furthermore, a carrier control type magnetoresistance effect element according to another aspect of the present disclosure includes any one of the above-described magnetoresistance effect elements, an insulating layer provided on the third region, and an electrode provided on the third region with the insulating layer therebetween and provided to be spaced apart from the first ferromagnetic layer and the second ferromagnetic layer.

Further, a magnetic sensor according to an aspect of the present disclosure includes any one of the above-described magnetoresistance effect elements.

Further, a spin transistor according to an aspect of the present disclosure includes any one of the above-described magnetoresistance effect elements, an insulating layer provided on the third region, and an electrode provided on the third region with the insulating layer therebetween and provided to be spaced apart from the first ferromagnetic layer and the second ferromagnetic layer. The first region and the second region have the same conductivity type as the third region. The electrode serves as a gate electrode. One of the first ferromagnetic layer and the second ferromagnetic layer serves as a source electrode. The other one of the first ferromagnetic layer and the second ferromagnetic layer serves as a drain electrode.

Further, a spin transistor according to another aspect of the present disclosure includes a magnetoresistance effect element including a semiconductor layer, and a first ferromagnetic layer and a second ferromagnetic layer provided on an upper surface of the semiconductor layer to be spaced apart from each other in a first direction. The semiconductor layer has a first region, a second region and a third region each of which includes a part of the upper surface of the semiconductor layer and a part of a lower surface of the semiconductor layer and contains the same semiconductor material as a base material. The first ferromagnetic layer is provided on the first region. The second ferromagnetic layer is provided on the second region. The third region is sandwiched between the first region and the second region in the first direction. Crystal orientations of the semiconductor material in the first direction are substantially the same in the first region, the second region, and the third region. An interatomic distance of the third region in the crystal orientation of the semiconductor material in the first direction in an upper surface neighboring region including the upper surface is larger than an interatomic distance of the third region in the crystal orientation of the semiconductor material in the first direction in a lower surface neighboring region including the lower surface. An insulating layer is provided on the third region. An electrode is provided on the third region with the insulating layer therebetween and provided to be spaced apart from the first ferromagnetic layer and the second ferromagnetic layer. The first region and the second region have n-type conductivity. The electrode serves as a gate electrode. One of the first ferromagnetic layer and the second ferromagnetic layer serves as a source electrode. The other one of the first ferromagnetic layer and the second ferromagnetic layer serves as a drain electrode. The third region has p-type conductivity when no voltage is applied to the gate electrode. The gate electrode is configured to be capable of applying a voltage so that an inversion layer having n-type conductivity is formed in at least a part of the upper surface neighboring region of the third region.

Further, a spin transistor according to another aspect of the present disclosure includes a magnetoresistance effect element including a semiconductor layer, and a first ferromagnetic layer and a second ferromagnetic layer provided on an upper surface of the semiconductor layer to be spaced apart from each other in a first direction. The semiconductor layer has a first region, a second region and a third region each of which includes a part of the upper surface of the semiconductor layer and a part of a lower surface of the semiconductor layer and contains the same semiconductor material as a base material. The first ferromagnetic layer is provided on the first region. The second ferromagnetic layer is provided on the second region. The third region is sandwiched between the first region and the second region in the first direction. Crystal orientations of the semiconductor material in the first direction are substantially the same in the first region, the second region, and the third region. An interatomic distance of the third region in the crystal orientation of the semiconductor material in the first direction in an upper surface neighboring region including the upper surface is smaller than an interatomic distance of the third region in the crystal orientation of the semiconductor material in the first direction in a lower surface neighboring region including the lower surface. An insulating layer is provided on the third region. An electrode is provided on the third region with the insulating layer therebetween and provided to be spaced apart from the first ferromagnetic layer and the second ferromagnetic layer. The first region and the second region have p-type conductivity. The electrode serves as a gate electrode. One of the first ferromagnetic layer and the second ferromagnetic layer serves as a source electrode. The other one of the first ferromagnetic layer and the second ferromagnetic layer serves as a drain electrode. The third region has n-type conductivity when no voltage is applied to the gate electrode. The gate electrode is configured to be capable of applying a voltage so that an inversion layer having p-type conductivity is formed in at least a part of the upper surface neighboring region of the third region.

DETAILED DESCRIPTION

Figure 1:
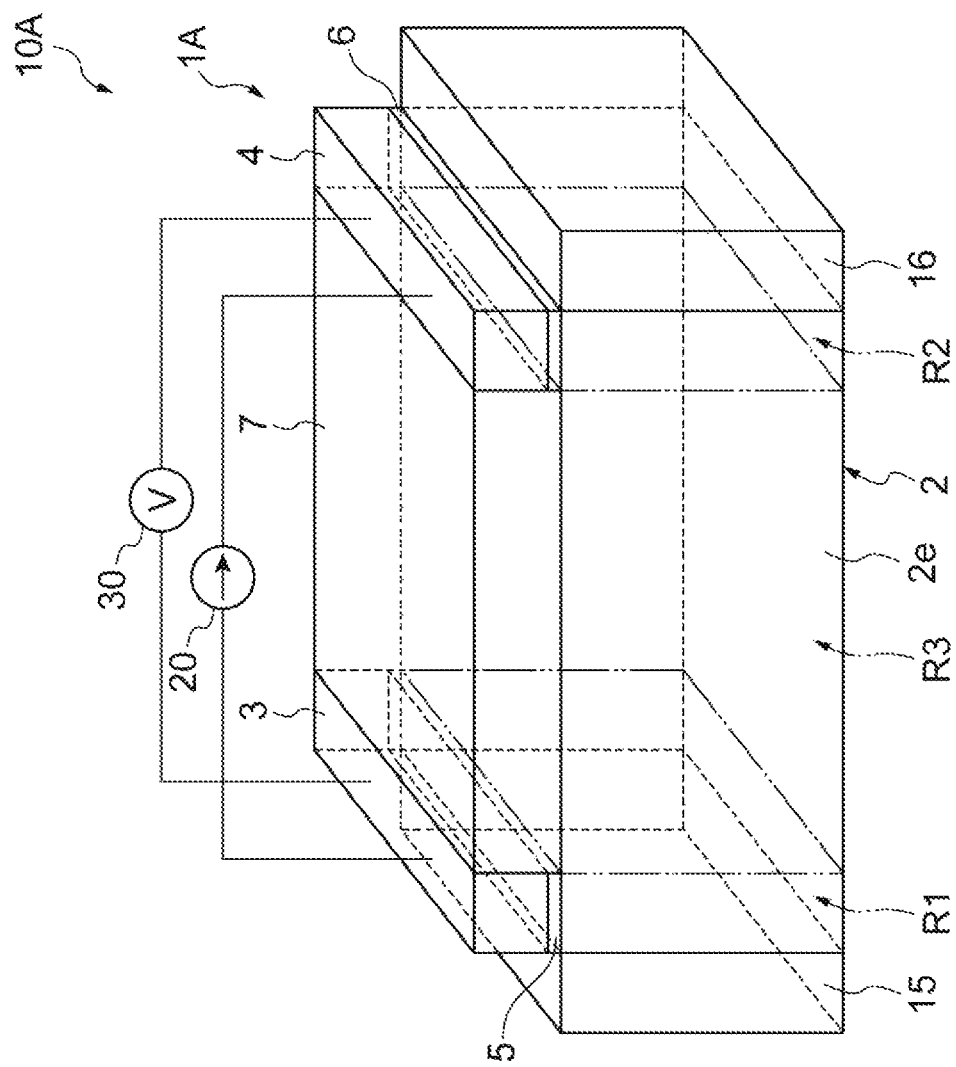
FIG. 1 is a perspective view showing a magnetic sensor according to a first embodiment.

Hereinafter, modes for carrying out the present disclosure will be described in detail with reference to the accompanying drawings. In each of the drawings, the same reference numerals are used for the same elements when possible. In addition, dimensional ratios in the constituent elements and between the constituent elements in the drawings are respectively arbitrary for ease of viewing of the drawings.

First Embodiment

Figure 2:
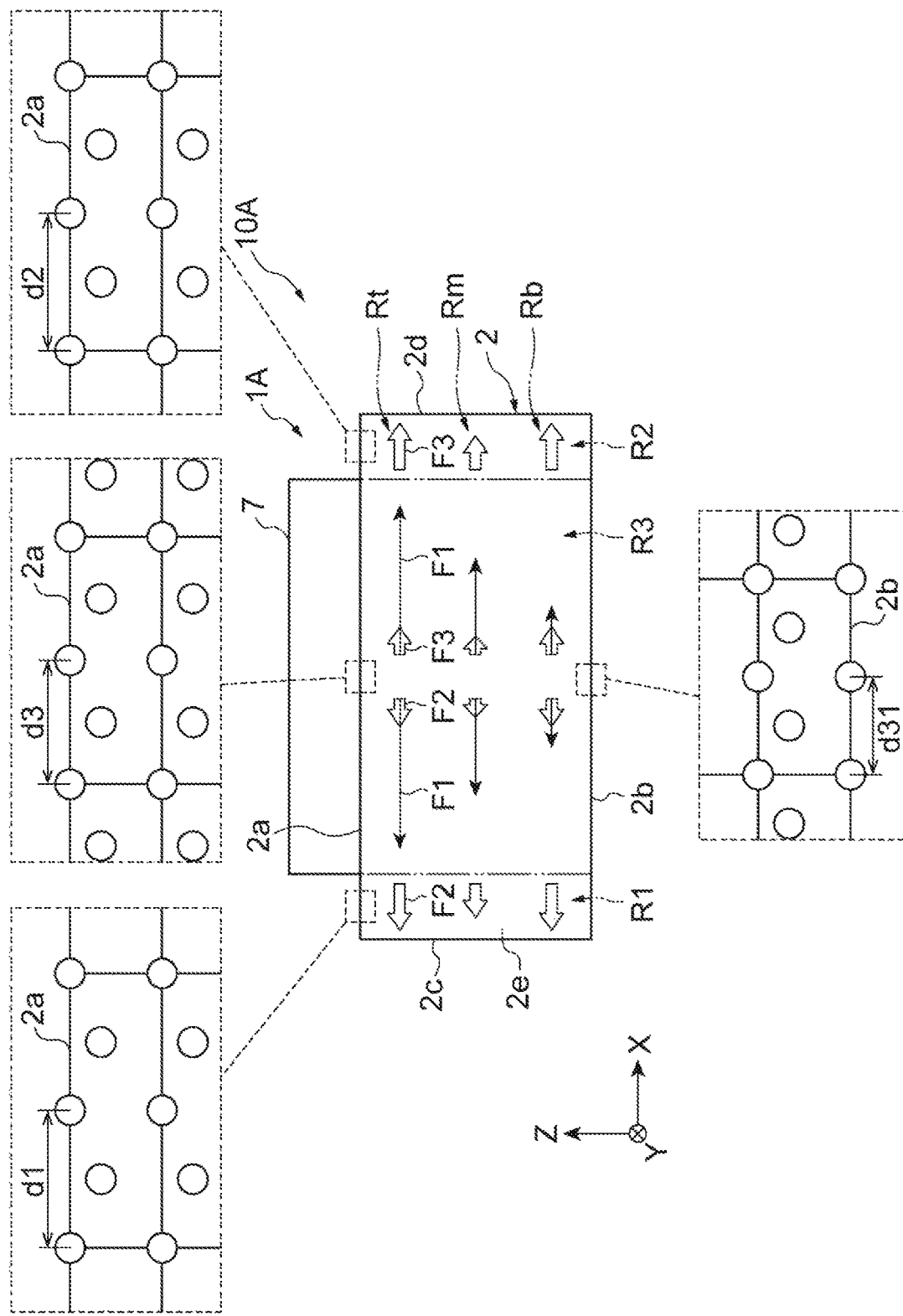
FIG. 2 is a partially enlarged side view of the magnetic sensor shown in FIG. 1.
Figure 3:
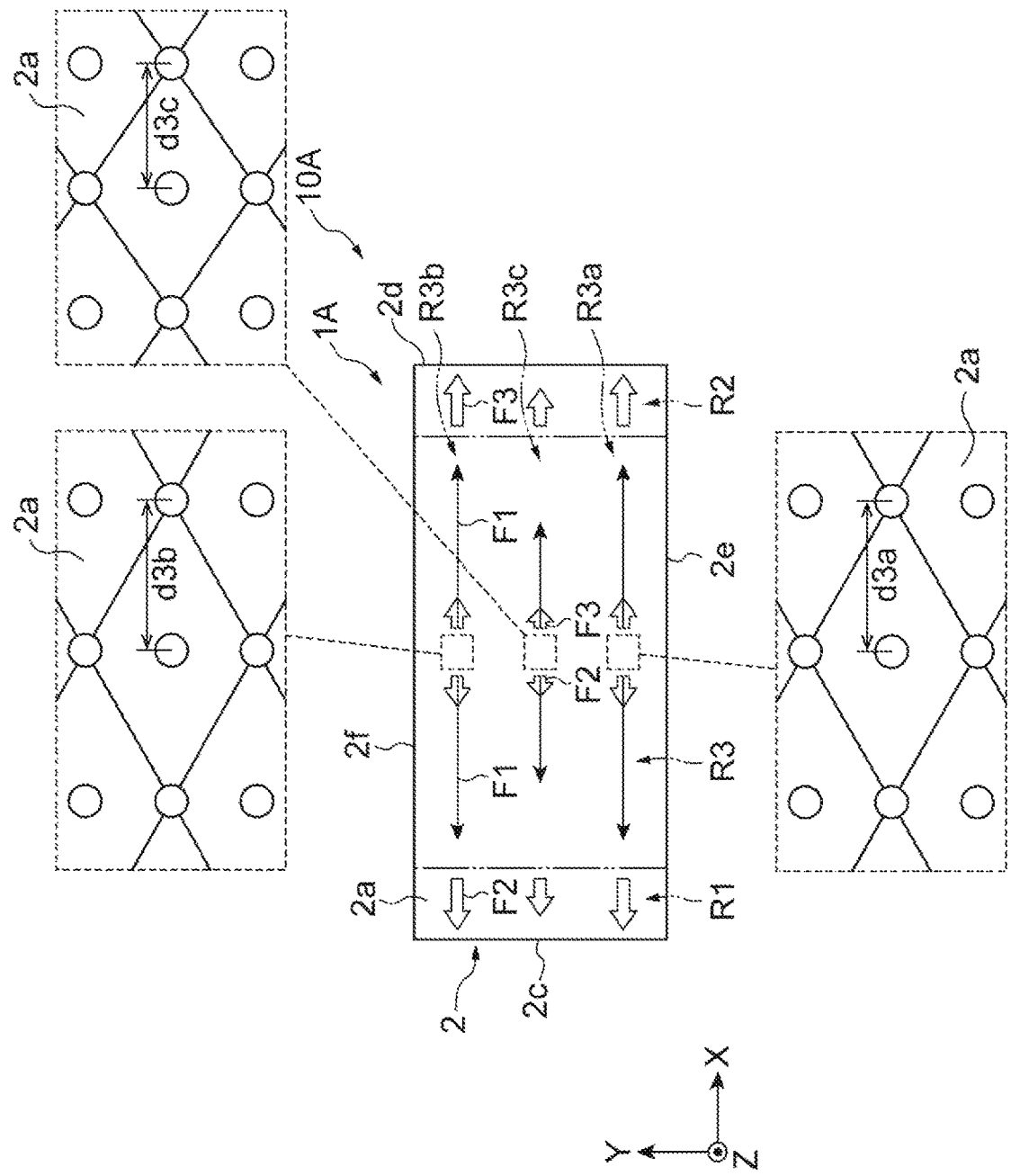
FIG. 3 is a partially enlarged top view of the magnetic sensor shown in FIG. 1.

With reference to FIGS. 1 to 3, a magnetoresistance effect element 1A and a magnetic sensor 10A according to a first embodiment will be described. FIG. 1 is a perspective view showing a magnetic sensor according to the first embodiment. FIG. 2 is a partially enlarged side view of the magnetic sensor shown in FIG. 1. FIG. 3 is a partially enlarged top view of the magnetic sensor shown in FIG. 1. In FIGS. 1 to 3, an orthogonal coordinate system is shown.

As shown in FIGS. 1 to 3, the magnetic sensor 10A includes the magnetoresistance effect element 1A and is connected to a current source 20 and a voltage measurement unit 30. The magnetoresistance effect element 1A includes a semiconductor layer 2, a first ferromagnetic layer 3, a second ferromagnetic layer 4, a first insulating layer 5, a second insulating layer 6, a first protective film 7, a second protective film 15, and a third protective film 16. In FIG. 2, illustration other than the semiconductor layer 2 and the first protective film 7 is omitted. In FIG. 3, illustration other than the semiconductor layer 2 is omitted.

The semiconductor layer 2 functions as a layer in which spins transport and/or diffuse. The semiconductor layer 2 has a rectangular parallelepiped shape. The semiconductor layer 2 includes an upper surface 2a and a lower surface 2b facing each other in a Z direction, side surfaces 2c and 2d facing each other in an X direction, and side surfaces 2e and 2f facing each other in a Y direction. In the embodiment, the upper surface 2a, the lower surface 2b, and the side surfaces 2c, 2d, 2e and 2f are substantially flat, but these surfaces may be curved.

The semiconductor layer 2 is composed of, for example, a semiconductor material, such as Si, Ge, C (diamond), GaAs or the like having a cubic or pseudo-cubic crystal structure, as a base material. A pseudo-cubic crystal is a crystal structure which is not a cubic crystal (a1=a2=a3 and $\alpha=\beta=\gamma=90°$) due to strain generation. That is, a pseudo-cubic crystal is a crystal structure in which a crystal structure (basic crystal structure) in a state in which strain is not generated is cubic. Crystal orientations of the semiconductor material of the semiconductor layer 2 in the X direction are [110]. Impurities for imparting a conductivity type are added to the semiconductor material (the base material) of the semiconductor layer 2. In order for the semiconductor layer 2 to have n-type conductivity, an element having a valence electron number larger than that of the semiconductor material (the base material) is added as an impurity. In order for the semiconductor layer 2 to have p-type conductivity, an element having a valence electron number smaller than that of the semiconductor material (the base material) is added as an impurity. When the semiconductor material (the base material) included in the semiconductor layer 2 is Si, impurities for imparting n-type conductivity include P, As, Sb, and so on, and impurities for imparting p-type conductivity include B, Al, Ga, In and so on. The semiconductor layer 2 of the embodiment has n-type conductivity.

The semiconductor layer 2 has a first region R1, a second region R2, and a third region R3. Each of the first region R1, the second region R2, and the third region R3 includes a part of the upper surface 2a and a part of the lower surface 2b. The first region R1 includes one end region of each of the upper surface 2a, the lower surface 2b, the side surface 2e and the side surface 2f in the X direction, and the entire side surface 2c. The second region R2 includes the other end region of each of the upper surface 2a, the lower surface 2b, the side surface 2e and the side surface 2f in the X direction, and the entire side surface 2d. The third region R3 includes a center region of each of the upper surface 2a, the lower surface 2b, the side surface 2e and the side surface 2f in the X direction. The third region R3 is sandwiched between the first region R1 and the second region R2 in the X direction. The first region R1, the third region R3 and the second region R2 are linearly arranged in this order along the X direction.

The first region R1, the second region R2, and the third region R3 contain the same semiconductor material as the base material. In the first region R1, the second region R2, and the third region R3, the crystal orientations of this semiconductor material in at least the X direction are substantially the same. That is, the crystal orientation of the semiconductor material in the X-direction in the first region R1, the crystal orientation of the semiconductor material in the X-direction in the second region R2, and the crystal orientation of the semiconductor material in the X direction in the third region R3 may be completely coincident with each other or may cross each other at an intersection angle of 5° or less, for example.

For example, in the first region R1, the second region R2 and the third region R3, it is possible to make the crystal orientations of this semiconductor material in at least the X direction substantially the same by constituting the entire semiconductor layer 2 with a single crystal. When the entire semiconductor layer 2 is composed of a single crystal, the crystal orientations of this semiconductor material in other than the X direction can be the same in the first region R1, the second region R2, and the third region R3. In the embodiment, the first region R1, the second region R2 and the third region R3 have n-type conductivity. In the first region R1, the second region R2 and the third region R3, the crystal orientations of the semiconductor material in the X direction are substantially [110]. That is, the crystal orientations of the semiconductor material in the X direction may completely coincide with the [110] direction, or may cross the [110] direction at an intersection angle of 5° or less (it may be inclined from the [110] direction at the inclination angle of 5° or less). In addition, the upper surface 2a is substantially a (001) plane. That is, the upper surface 2a may completely coincide with the (001) plane or may cross the (001) plane at an intersection angle of 5° or less (it may be inclined from the (001) plane at an inclination angle of 5° or less).

The semiconductor layer 2 has an upper surface neighboring region Rt, a lower surface neighboring region Rb, and a central region Rm. The upper surface neighboring region Rt includes the upper surface 2a. The upper surface neighboring region Rt is constituted by regions in the vicinities of the upper surface 2a in the first region R1, the second region R2 and the third region R3. The lower surface neighboring region Rb includes the lower surface 2b. The lower surface neighboring region Rb is constituted by regions in the vicinities of the lower surface 2b in the first region R1, the second region R2 and the third region R3. The central region Rm is disposed between the upper surface neighboring region Rt and the lower surface neighboring region Rb in the Z direction. The upper surface neighboring region Rt is, for example, a region within 10 nm or 20 nm from the upper surface 2a. The lower surface neighboring region Rb is, for example, a region within 10 nm or 20 nm from the lower surface 2b.

The first ferromagnetic layer 3 and the second ferromagnetic layer 4 are provided on the upper surface 2a of the semiconductor layer 2 to be spaced apart from each other in the X direction as a first direction. The first ferromagnetic layer 3 is provided on the first region R1. The first ferromagnetic layer 3 is provided to cover an upper surface of the first region R1 (one end region of the upper surface 2a in the X direction). The second ferromagnetic layer 4 is provided on the second region R2. The second ferromagnetic layer 4 is provided to cover an upper surface of the second region R2 (the other end region of the upper surface 2a in the X direction). A length of the first ferromagnetic layer 3 and the second ferromagnetic layer 4 in the Y direction is the same as a length of the upper surface 2a in the Y direction. One of the first ferromagnetic layer 3 and the second ferromagnetic layer 4 serves as a magnetization fixed layer, and the other one of the first ferromagnetic layer 3 and the second ferromagnetic layer 4 serves as a magnetization free layer. In the embodiment, the first ferromagnetic layer 3 serves as a magnetization free layer, and the second ferromagnetic layer 4 serves as a magnetization fixed layer.

The first ferromagnetic layer 3 and the second ferromagnetic layer 4 are composed of a ferromagnetic material. For example, a metal or an alloy having at least one element selected from Ni, Fe and Co may be used as the ferromagnetic material of the first ferromagnetic layer 3 and the second ferromagnetic layer 4. More specifically, a Co—Fe alloy, a Ni—Fe alloy, a Co—B alloy, an Fe—B alloy or a Co—Fe—B alloy may be used. A Heusler alloy such as a Co—Fe—Al alloy, a Co—Fe—Si alloy, a Co—Mn—Si alloy, a Co—Mn—Ge alloy, a Co—Fe—Al—Si alloy, and a Co—Fe—Ga—Ge alloy may be used. A coercive force of the second ferromagnetic layer 4 in a direction in which an external magnetic field is applied is larger than a coercive force of the first ferromagnetic layer 3 in the direction in which an external magnetic field is applied. For example, the coercive force of the second ferromagnetic layer 4 may be larger than the coercive force of the first ferromagnetic layer 3 due to selecting a hard magnetic material for the second ferromagnetic layer 4 and selecting a soft magnetic material for the first ferromagnetic layer 3. Further, the coercive force of the second ferromagnetic layer 4 may be larger than the coercive force of the first ferromagnetic layer 3 due to exchange-coupling the second ferromagnetic layer 4 to an antiferromagnetic layer.

The first insulating layer 5 and the second insulating layer 6 are insulating films which develop a tunnel magnetoresistance effect. The first insulating layer 5 and the second insulating layer 6 are provided on the upper surface 2a of the semiconductor layer 2. The first insulating layer 5 and the second insulating layer 6 are in direct contact with the upper surface 2a. The first insulating layer 5 is provided between the upper surface 2a and the first ferromagnetic layer 3. That is, the first ferromagnetic layer 3 is provided on the upper surface 2a with the first insulating layer 5 interposed therebetween. The second insulating layer 6 is provided between the upper surface 2a of the semiconductor layer 2 and the second ferromagnetic layer 4. That is, the second ferromagnetic layer 4 is provided on the upper surface 2a with the second insulating layer 6 interposed therebetween. According to the first insulating layer 5 and the second insulating layer 6, spin injection efficiency and spin extraction efficiency are improved.

Film thicknesses of the first insulating layer 5 and the second insulating layer 6 can be set to 3 nm or less from the viewpoint of suppressing an increase in resistance and making it serve as a tunnel insulating layer. Further, the film thickness of the first insulating layer 5 and the second insulating layer 6 can be set to 0.4 nm or more in consideration of a thickness of one atomic layer. The first insulating layer 5 and the second insulating layer 6 are composed of, for example, magnesium oxide. When the first insulating layer 5 and the second insulating layer 6 are composed of magnesium oxide, the spin injection efficiency and the spin extraction efficiency are particularly improved.

The first protective film 7 is provided on the upper surface 2a of the semiconductor layer 2 to be sandwiched between the first ferromagnetic layer 3 and the second ferromagnetic layer 4 in the X direction. The first protective film 7 extends in the X direction to connect the first ferromagnetic layer 3 and the second ferromagnetic layer 4 to each other. The first protective film 7 is provided to cover at least an upper surface of the third region R3 (a central region of the upper surface 2a in the X direction). The first protective film 7 is in direct contact with the upper surface of the third region R3. A length of the first protective film 7 in the Y direction is the same as a length of the upper surface 2a in the Y direction.

The second protective film 15 is provided to cover an end portion of the first region R1 on the side opposite to the third region R3 side in the X direction. Specifically, the second protective film 15 is provided to cover the side surface 2c. The second protective film 15 is provided to cover the entire surface of the side surface 2c. The second protective film 15 is in direct contact with the side surface 2c.

The third protective film 16 is provided to cover an end portion of the second region R2 on the side opposite to the third region R3 side in the X direction. Specifically, the third protective film 16 is provided to cover the side surface 2d. The third protective film 16 is provided to cover the entire surface of the side surface 2d. The third protective film 16 is in direct contact with the side surface 2d.

The first protective film 7, the second protective film 15 and the third protective film 16 include, for example, aluminum nitride, silicon nitride, or silicon oxide. The first protective film 7, the second protective film 15 and the third protective film 16 protect the semiconductor layer 2 from deterioration due to oxidation, for example. The first protective film 7, the second protective film 15 and the third protective film 16 also serve as strain imparting films which apply strain to the semiconductor layer 2. The first protective film 7 serves as a strain imparting film which applies strain particularly to the third region R3. The second protective film 15 serves as a strain imparting film which applies strain particularly to the first region R1 and the third region R3. The third protective film 16 serves as a strain imparting film which applies strain particularly to the second region R2 and the third region R3. In general, the magnitude and polarity (tensile stress or compressive stress) of internal stress remaining in a film after film deposition are related to a grain boundary density in the film. A force (the compressive stress) for expanding tends to remain as an internal stress in a film having a low grain boundary density, and a force for contracting (the tensile stress) tends to remain as an internal stress in a film having a high grain boundary density.

The grain boundary density in the film can be controlled by film deposition conditions (a film deposition method, a film deposition temperature, a pressure during the film deposition, and so on). For example, in a sputtering method, since a kinetic energy of atoms (molecules) to be deposited is larger than that in an electron beam evaporation method, the atoms (molecules) move on a film surface to fill the grain boundaries during a film deposition process, and as a result, a film having a low grain boundary density tends to be formed. Therefore, in a film formed by a sputtering method, the force for expanding (the compressive stress) tends to remain as an internal stress. On the other hand, in the film formed by the electron beam evaporation method, the force for contracting (the tensile stress) tends to remain as an internal stress. In this way, the magnitudes and polarities of the internal stresses remaining in the first protective film 7, the second protective film 15 and the third protective film 16 after the film deposition can be controlled by controlling the grain boundary densities in the first protective film 7, the second protective film 15 and the third protective film 16 by the film deposition conditions.

In the embodiment, the first protective film 7 imparts tensile strain to the third region R3 along the X direction. The second protective film 15 imparts tensile strain particularly to the first region R1 and the third region R3 along the X direction. The third protective film 16 imparts tensile strain particularly to the second region R2 and the third region R3 along the X direction.

FIG. 2 enlargedly and schematically shows a form of atom arrangement at a plurality of portions of a (110) plane (a (1-10) plane), which is a cross section along an XZ plane, in the semiconductor layer 2. FIG. 3 enlargedly and schematically shows a form of atom arrangement at a plurality of portions of a (001) plane, which is a cross section along an XY plane, in the semiconductor layer 2. In FIGS. 2 and 3, modes of forces F1 applied from the first protective film 7 (forces due to the internal stress of the first protective film 7) to the semiconductor layer 2 are schematically indicated by solid arrows. Modes of forces F2 applied from the second protective film 15 (forces due to the internal stress of the second protective film 15) to the semiconductor layer 2 and forces F3 applied from the third protective film 16 (forces due to the internal stress of the third protective film 16) to the semiconductor layer 2 are schematically indicated by void arrows. These arrows are just images and do not represent exact points of action and magnitudes of the forces. In the embodiment, the first protective film 7 has a compressive stress (a force for expanding) as an internal stress, and the second protective film 15 and the third protective film 16 have tensile stresses (forces for contracting) as internal stresses. As described above, since tensile strain along the X direction is applied to each of the first region R1, the second region R2 and the third region R3, the interatomic distances of the first region R1, the second region R2 and the third region R3 in the crystal orientation of the semiconductor material in the X direction are larger as compared with the interatomic distances of the first region R1, the second region R2 and the third region R3 in the crystal orientation of the semiconductor material in the X direction when tensile strain along the X direction is not applied. The interatomic distance is a distance between centers of atoms. In FIGS. 2 and 3, for ease of understanding, a difference between the interatomic distances is exaggeratedly shown.

In particular, as shown in FIG. 2, in the third region R3, the force F1 applied from the first protective film 7 decreases from the upper surface 2a toward the lower surface 2b. In the third region R3, the force F2 applied from the second protective film 15 is larger in the upper surface neighboring region Rt and the lower surface neighboring region Rb than in the central region Rm. In the third region R3, the force F3 applied from the third protective film 16 is larger in the upper surface neighboring region Rt and the lower surface neighboring region Rb than in the central region Rm. An amount of change in the force F2 and the force F3 according to a position in the Z direction is much smaller than an amount of change in the force F1 according to the position in the Z direction. Moreover, in the third region R3, the force F2 applied from the second protective film 15 is equal in the upper surface neighboring region Rt and the lower surface neighboring region Rb. In the third region R3, the force F3 applied from the third protective film 16 is equal in the upper surface neighboring region Rt and the lower surface neighboring region Rb. Therefore, an interatomic distance d3 of the third region R3 in the crystal orientation of the semiconductor material in the X direction, that is, in the [110] direction, in the upper surface neighboring region Rt is larger than an interatomic distance d31 of the third region R3 in the crystal orientation of the semiconductor material in the X direction in the lower surface neighboring region Rb. The force F3 applied from the third protective film 16 in the first region R1 and the force F2 applied from the second protective film 15 in the second region R2 are not shown because they are small in magnitude.

The force F2 applied from the second protective film 15 becomes smaller as being away from the side surface 2c. The force F3 applied from the third protective film 16 becomes smaller as being away from the side surface 2d. Each of the forces F1, F2 and F3 is applied to the third region R3. In the embodiment, the first protective film 7, the second protective film 15 and the third protective film 16 are formed so that, in the upper surface neighboring region Rt, the force F2 applied from the second protective film 15 to the first region R1 is larger than a sum of the force F1 applied from the first protective film 7 to the third region R3 and the force F2 applied from the second protective film 15 to the third region R3, and in the upper surface neighboring region Rt, the force F3 applied from the third protective film 16 to the second region R2 is larger than a sum of the force F1 applied from the first protective film 7 to the third region R3 and the force F3 applied from the third protective film 16 to the third region R3. Accordingly, in the embodiment, an interatomic distance d1 of the first region R1 in the crystal orientation of the semiconductor material in the X direction in the upper surface neighboring region Rt and an interatomic distance d2 of the second region R2 in the crystal orientation of the semiconductor material in the X direction in the upper surface neighboring region Rt are larger than the interatomic distance d3 of the third region R3 in the crystal orientation of the semiconductor material in the X direction in the upper surface neighboring region Rt. The interatomic distance d1 and the interatomic distance d2 are, for example, the same as each other.

Particularly, as shown in FIG. 3, in the upper surface neighboring region Rt, the third region R3 has end regions R3a and R3b in a direction orthogonal to the X direction, that is, in the Y direction, and a central region R3c in the Y direction. The end region R3a is disposed on the side surface 2e side, and the end region R3b is disposed on the side surface 2f side. The force F1 applied from the first protective film 7 to the semiconductor layer 2 increases from a center of the third region R3 toward the side surfaces 2e and 2f in the Y direction. The force F2 applied from the second protective film 15 to the semiconductor layer 2 and the force F3 applied from the third protective film 16 to the semiconductor layer 2 also increase from the center of the third region R3 toward the side surfaces 2e and 2f in the Y direction. Therefore, an interatomic distance d3a of the end region R3a in the crystal orientation of the semiconductor material in the X direction and an interatomic distance d3b of the end region R3b in the crystal orientation of the semiconductor material in the X direction are larger than an interatomic distance d3c of the central region R3c in the crystal orientation of the semiconductor material in the X direction. The interatomic distance d3a and the interatomic distance d3b are, for example, the same as each other.

The current source 20 is a unit which is connected to the first ferromagnetic layer 3 and the second ferromagnetic layer 4 and passes a current between the second ferromagnetic layer 4 and the first ferromagnetic layer 3. In the embodiment, the current source 20 supplies a constant current flowing through the semiconductor layer 2 from the second ferromagnetic layer 4 toward the first ferromagnetic layer 3. The voltage measurement unit 30 is a unit which is connected to the first ferromagnetic layer 3 and the second ferromagnetic layer 4 and measures a voltage between the first ferromagnetic layer 3 and the second ferromagnetic layer 4.

In the magnetic sensor 10A, when a current from the second ferromagnetic layer 4 toward the first ferromagnetic layer 3 is supplied by the current source 20, electrons having spins (spin-polarized electrons) corresponding to a magnetization direction of the first ferromagnetic layer 3 are injected into the semiconductor layer 2 from the first ferromagnetic layer 3 serving as the magnetization free layer. The injected spin-polarized electrons transport through the third region R3, and the spins corresponding to the magnetization direction of the first ferromagnetic layer 3 are accumulated mainly in the second region R2 in the upper surface neighboring region Rt. The electrical resistance between the second ferromagnetic layer 4 and the second region R2 changes according to a relative angle between a direction of the spins accumulated in the second region R2 and the magnetization direction of the second ferromagnetic layer 4 (magnetoresistance effect). A spin output voltage corresponding to the change in the relative angle is generated between the first ferromagnetic layer 3 and the second ferromagnetic layer 4. Therefore, the magnetization direction of the first ferromagnetic layer 3 can be detected as a direction or magnitude of an external magnetic field by measuring the voltage between the first ferromagnetic layer 3 and the second ferromagnetic layer 4 with the voltage measurement unit 30. In addition to the spin output voltage, a voltage including a voltage drop due to a resistance of the semiconductor layer 2, a resistance of the first ferromagnetic layer 3, a resistance of the second ferromagnetic layer 4, a resistance between the first ferromagnetic layer 3 and the semiconductor layer 2 and a resistance between the second ferromagnetic layer 4 and the semiconductor layer 2 is measured in the voltage measurement unit 30.

The current source 20 may supply a constant current flowing through the semiconductor layer 2 from the first ferromagnetic layer 3 toward the second ferromagnetic layer 4. In this case, the spin-polarized electrons corresponding to the magnetization direction of the second ferromagnetic layer 4 are injected into the semiconductor layer 2 from the second ferromagnetic layer 4 serving as the magnetization fixed layer. Therefore, the spins corresponding to the magnetization direction of the second ferromagnetic layer 4 are accumulated mainly in the first region R1 in the upper surface neighboring region Rt.

In the magnetoresistance effect element 1A, the interatomic distance d3 is larger than the interatomic distance d31. Thus, the inventors of the present disclosure have found that a spin diffusion length and a spin lifetime of the spin-polarized electrons which transport or diffuse in the upper surface neighboring region Rt of the third region R3 of the semiconductor layer 2 can be increased, as compared with a case in which the interatomic distance d3 is equal to the interatomic distance d31. Accordingly, a spin accumulation effect in the semiconductor layer 2 (mainly in the second region R2) can be increased. Therefore, the magnetoresistance effect generated between the second ferromagnetic layer 4 and the semiconductor layer 2 can be increased. As a result, since an output signal can be increased, a large SN ratio can be obtained.

Further, in the magnetoresistance effect element 1A, since the first protective film 7 serves as the strain imparting film which imparts tensile strain to the third region R3 along the X direction, the relationship between the interatomic distance d3 and the interatomic distance d31 as described above can be easily realized.

Further, in the magnetoresistance effect element 1A, the first protective film 7 is in direct contact with the upper surface of the third region R3. Accordingly, since the force F1 applied from the first protective film 7 to the semiconductor layer 2 increases, the spin diffusion length and the spin lifetime of the spin-polarized electrons in the third region R3 can be increased. As a result, a larger SN ratio can be obtained.

Further, the magnetoresistance effect element 1A includes the second protective film 15 provided to cover the side surface 2c and the third protective film 16 provided to cover the side surface 2d. The second protective film 15 serves as a strain imparting film which imparts tensile strain particularly to the first region R1 and the third region R3 along the X direction. The third protective film 16 serves as a strain imparting film which imparts tensile strain particularly to the second region R2 and the third region R3 along the X direction. Thus, the relationship between the interatomic distances d1, d2 and d3 as described above can be easily realized.

Further, in the magnetoresistance effect element 1A, the second protective film 15 is in direct contact with the side surface 2c, and the third protective film 16 is in direct contact with the side surface 2d. Thus, since the force F2 applied from the second protective film 15 to the semiconductor layer 2 and the force F3 applied from the third protective film 16 to the semiconductor layer 2 increase, the spin diffusion length and the spin lifetime of the spin-polarized electrons in the semiconductor layer 2 can be increased. As a result, a larger SN ratio can be obtained.

Further, in the magnetoresistance effect element 1A, the semiconductor material of the semiconductor layer 2 has a cubic or pseudo-cubic crystal structure, and in the first region R1, the second region R2, and the third region R3, the crystal orientations of the semiconductor material in the X direction are substantially [110]. Thus, a larger SN ratio can be obtained.

Since the magnetic sensor 10A includes the magnetoresistance effect element 1A, a large SN ratio can be obtained.

Second Embodiment

Figure 4:
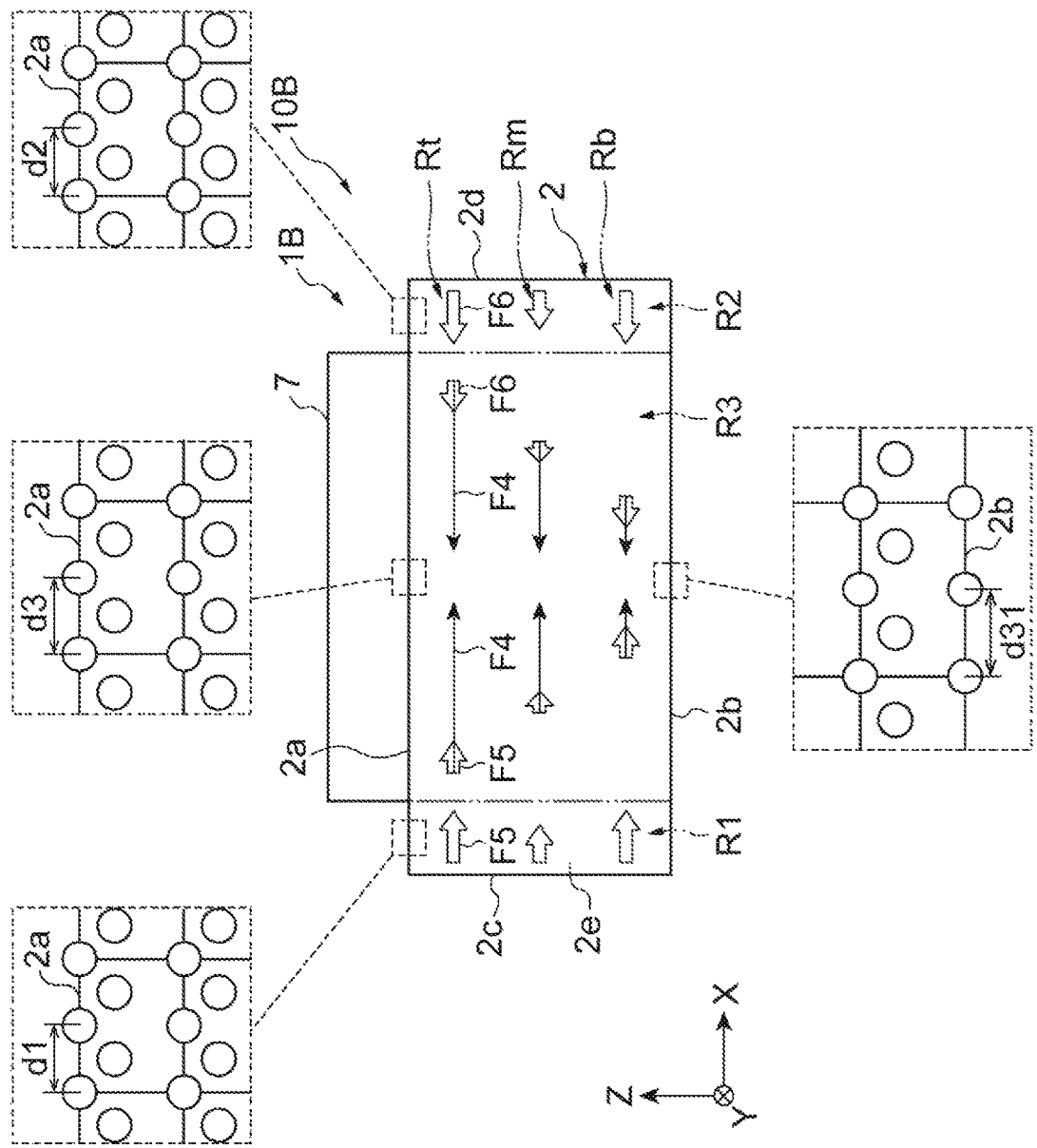
FIG. 4 is a partially enlarged side view showing a magnetic sensor according to a second embodiment.
Figure 5:
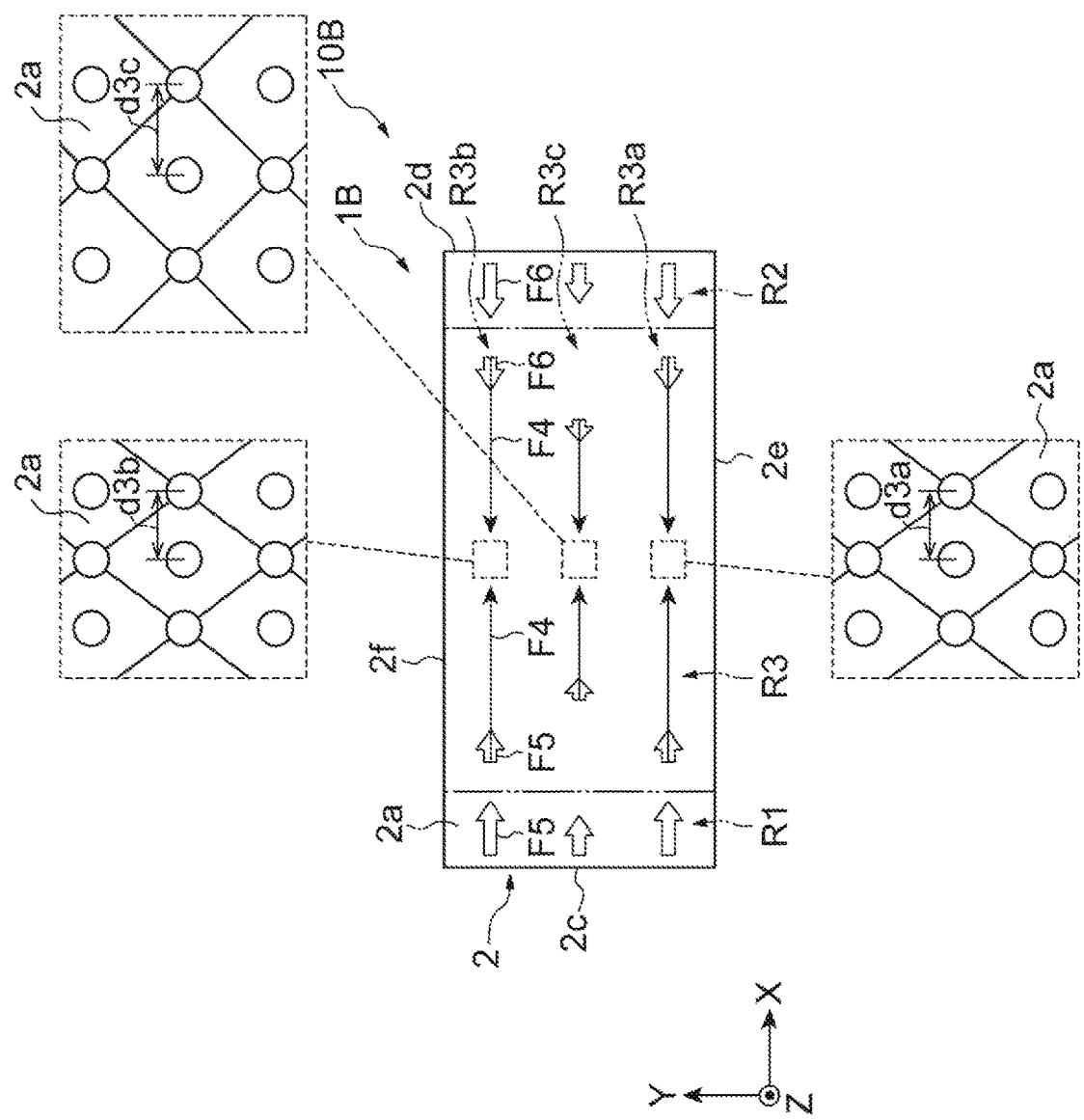
FIG. 5 is a partially enlarged top view showing the magnetic sensor according to the second embodiment.

A magnetoresistance effect element 1B and a magnetic sensor 10B according to a second embodiment will be described with reference to FIGS. 4 and 5 focusing on differences from the magnetoresistance effect element 1A and the magnetic sensor 10A (refer to FIG. 1) according to the first embodiment. FIG. 4 is a partially enlarged side view showing the magnetic sensor according to the second embodiment. FIG. 5 is a partially enlarged top view showing the magnetic sensor according to the second embodiment. In FIG. 4, illustration other than the semiconductor layer 2 and the first protective film 7 is omitted. In FIG. 5, illustration other than the semiconductor layer 2 is omitted. In FIGS. 4 and 5, an orthogonal coordinate system is shown. FIG. 4 enlargedly and schematically shows a form of atom arrangement at a plurality of portions of a (110) plane (a (1-10) plane), which is a cross section along an XZ plane, in the semiconductor layer 2. FIG. 5 enlargedly and schematically shows a form of atom arrangement at a plurality of portions of a (001) plane, which is a cross section along an XY plane, in the semiconductor layer 2.

In the magnetoresistance effect element 1B shown in FIGS. 4 and 5, the semiconductor layer 2 has p-type conductivity instead of n-type conductivity. That is, the first region R1, the second region R2 and the third region R3 have p-type conductivity instead of n-type conductivity. The first protective film 7 imparts compressive strain to the third region R3 along the X direction. The second protective film 15 imparts compressive strain particularly to the first region R1 and the third region R3 along the X direction. The third protective film 16 imparts compressive strain particularly to the second region R2 and the third region R3 along the X direction. In FIGS. 4 and 5, modes of forces F4 applied from the first protective film 7 (forces due to the internal stress of the first protective film 7) to the semiconductor layer 2 are schematically indicated by solid arrows, and modes of forces F5 applied from the second protective film 15 (forces due to the internal stress of the second protective film 15) to the semiconductor layer 2 and forces F6 applied from the third protective film 16 (forces due to the internal stress of the third protective film 16) to the semiconductor layer 2 are schematically indicated by outline arrows. These arrows are just images and do not represent exact points of action and magnitudes of the forces. In the embodiment, the first protective film 7 has a tensile stress (force for contracting) as the internal stress, and the second protective film 15 and the third protective film 16 have compressive stresses (forces for expanding) as the internal stresses. As described above, since compressive strain along the X direction is applied to each of the first region R1, the second region R2 and the third region R3, the interatomic distances of the first region R1, the second region R2 and the third region R3 in the crystal orientation of the semiconductor material in the X direction are smaller as compared with the interatomic distances of the first region R1, the second region R2 and the third region R3 in the crystal orientation of the semiconductor material in the X direction when compressive strain along the X direction is not applied. In FIG. 4 and FIG. 5, for ease of understanding, the difference between interatomic distances is exaggeratedly shown.

Particularly, as shown in FIG. 4, in the third region R3, the force F4 applied from the first protective film 7 decreases from the upper surface 2a toward the lower surface 2b. In the third region R3, the force F5 applied from the second protective film 15 is larger in the upper surface neighboring region Rt and the lower surface neighboring region Rb than in the central region Rm. In the third region R3, the force F6 applied from the third protective film 16 is larger in the upper surface neighboring region Rt and the lower surface neighboring region Rb than in the central region Rm. An amount of change in the force F5 and the force F6 according to a position in the Z direction is much smaller than an amount of change in the force F4 according to the position in the Z direction. Moreover, in the third region R3, the force F5 applied from the second protective film 15 is equal in the upper surface neighboring region Rt and the lower surface neighboring region Rb. In the third region R3, the force F6 applied from the third protective film 16 is equal in the upper surface neighboring region Rt and the lower surface neighboring region Rb. Therefore, the interatomic distance d3 is smaller than the interatomic distance d31. Also, the force F6 applied from the third protective film 16 in the first region R1 and the force F5 applied from the second protective film 15 in the second region R2 are not shown because they are small in magnitude.

The force F5 applied from the second protective film 15 becomes smaller as being away from the side surface 2c. The force F6 applied from the third protective film 16 becomes smaller as being away from the side surface 2d. Each of the forces F4, F5 and F6 is applied to the third region R3. In the embodiment, the first protective film 7, the second protective film 15 and the third protective film 16 are formed so that, in the upper surface neighboring region Rt, the force F5 applied from the second protective film 15 to the first region R1 is larger than a sum of the force F4 applied from the first protective film 7 to the third region R3 and the force F5 applied from the second protective film 15 to the third region R3, and in the upper surface neighboring region Rt, the force F6 applied from the third protective film 16 to the second region R2 is larger than a sum of the force F4 applied from the first protective film 7 to the third region R3 and the force F6 applied from the third protective film 16 to the third region R3. Accordingly, in the embodiment, the interatomic distance d1 and the interatomic distance d2 are smaller than the interatomic distance d3.

In particular, as shown in FIG. 5, the force F4 applied from the first protective film 7 to the semiconductor layer 2 increases from the center of the third region R3 toward the side surfaces 2e and 2f in the Y direction. The force F5 applied from the second protective film 15 to the semiconductor layer 2 and the force F6 applied from the third protective film 16 to the semiconductor layer 2 also increase from the center of the third region R3 toward the side surfaces 2e and 2f in the Y direction. Thus, the interatomic distance d3a and the interatomic distance d3b are smaller than the interatomic distance d3c.

In the magnetic sensor 10B, when a constant current flowing through the semiconductor layer 2 from the first ferromagnetic layer 3 to the second ferromagnetic layer 4 is supplied by the current source 20, holes having spins (spin-polarized holes) corresponding to the magnetization direction of the first ferromagnetic layer 3 are injected into the semiconductor layer 2 from the first ferromagnetic layer 3 serving as the magnetization free layer. The injected spin-polarized holes transport through the third region R3, and the spins corresponding to the magnetization direction of the first ferromagnetic layer 3 are accumulated mainly in the second region R2 in the upper surface neighboring region Rt. The electrical resistance between the second ferromagnetic layer 4 and the second region R2 changes according to a relative angle between the direction of the spins accumulated in the second region R2 and the magnetization direction of the second ferromagnetic layer 4 (magnetoresistance effect). A spin output voltage corresponding to the change in the relative angle is generated between the first ferromagnetic layer 3 and the second ferromagnetic layer 4. Therefore, the magnetization direction of the first ferromagnetic layer 3 can be detected as a direction or magnitude of an external magnetic field by measuring the voltage between the first ferromagnetic layer 3 and the second ferromagnetic layer 4 with the voltage measurement unit 30. In addition to the spin output voltage, a voltage including a voltage drop due to a resistance of the semiconductor layer 2, a resistance of the first ferromagnetic layer 3, a resistance of the second ferromagnetic layer 4, a resistance between the first ferromagnetic layer 3 and the semiconductor layer 2 and a resistance between the second ferromagnetic layer 4 and the semiconductor layer 2 is measured in the voltage measurement unit 30.

The current source 20 may supply a constant current flowing through the semiconductor layer 2 from the second ferromagnetic layer 4 toward the first ferromagnetic layer 3. In this case, the spin-polarized holes corresponding to the magnetization direction of the second ferromagnetic layer 4 are injected into the semiconductor layer 2 from the second ferromagnetic layer 4 serving as the magnetization fixed layer. Therefore, the spins corresponding to the magnetization direction of the second ferromagnetic layer 4 are accumulated mainly in the first region R1 in the upper surface neighboring region Rt.

In the magnetoresistance effect element 1B, the inventors of the present disclosure have found that, since the interatomic distance d3 is smaller than the interatomic distance d31, a spin diffusion length and a spin lifetime of the spin-polarized holes which transport or diffuse in the upper surface neighboring region Rt of the third region R3 of the semiconductor layer 2 can be increased, as compared with a case in which the interatomic distance d3 is equal to the interatomic distance d31. Accordingly, a spin accumulation effect in the semiconductor layer 2 (mainly in the second region R2) can be increased. Therefore, the magnetoresistance effect generated between the second ferromagnetic layer 4 and the semiconductor layer 2 can be increased. As a result, since an output signal can be increased, a large SN ratio can be obtained.

Further, in the magnetoresistance effect element 1B, since the first protective film 7 serves as the strain imparting film which imparts compressive strain to the third region R3 along the X direction, the relationship between the interatomic distance d3 and the interatomic distance d31 as described above can be easily realized.

Further, in the magnetoresistance effect element 1B, the first protective film 7 is in direct contact with the upper surface of the third region R3. Accordingly, since the force F4 applied from the first protective film 7 to the semiconductor layer 2 increases, the spin diffusion length and the spin lifetime of the spin-polarized holes in the third region R3 can be increased. As a result, a larger SN ratio can be obtained.

Further, the magnetoresistance effect element 1B includes the second protective film 15 provided to cover the side surface 2c and the third protective film 16 provided to cover the side surface 2d. The second protective film 15 serves as a strain imparting film which imparts compressive strain particularly to the first region R1 and the third region R3 along the X direction. The third protective film 16 serves as a strain imparting film which imparts compressive strain particularly to the second region R2 and the third region R3 along the X direction. Thus, the relationship between the interatomic distances d1, d2 and d3 as described above can be easily realized.

Further, in the magnetoresistance effect element 1B, the second protective film 15 is in direct contact with the side surface 2c, and the third protective film 16 is in direct contact with the side surface 2d. Thus, since the force F5 applied from the second protective film 15 to the semiconductor layer 2 and the force F6 applied from the third protective film 16 to the semiconductor layer 2 increase, the spin diffusion length and the spin lifetime of the spin-polarized holes in the semiconductor layer 2 can be increased. As a result, a larger SN ratio can be obtained.

Since the magnetic sensor 10B includes the magnetoresistance effect element 1B, a large SN ratio can be obtained.

Third Embodiment

Figure 6:
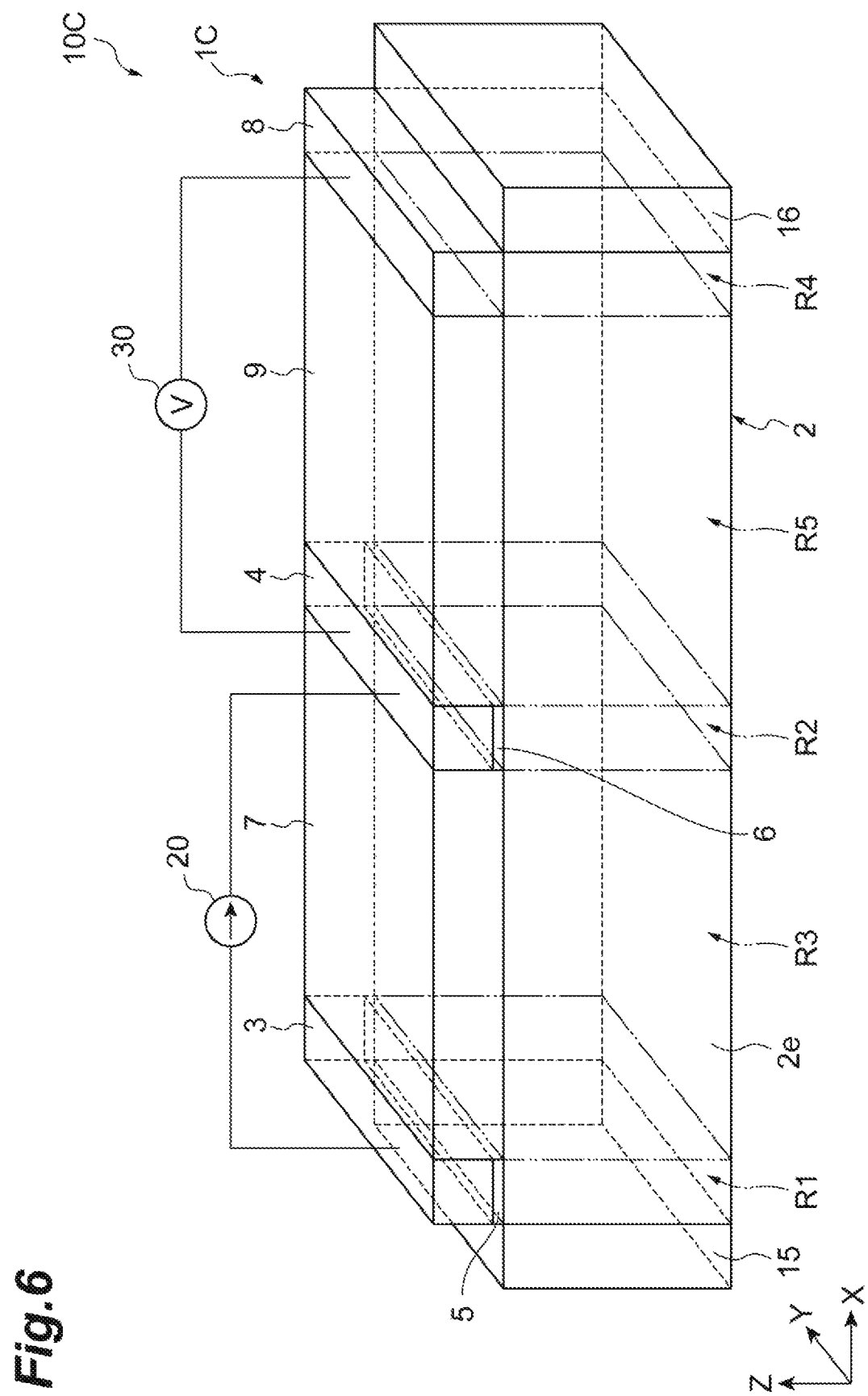
FIG. 6 is a perspective view showing a magnetic sensor according to a third embodiment.
Figure 7:
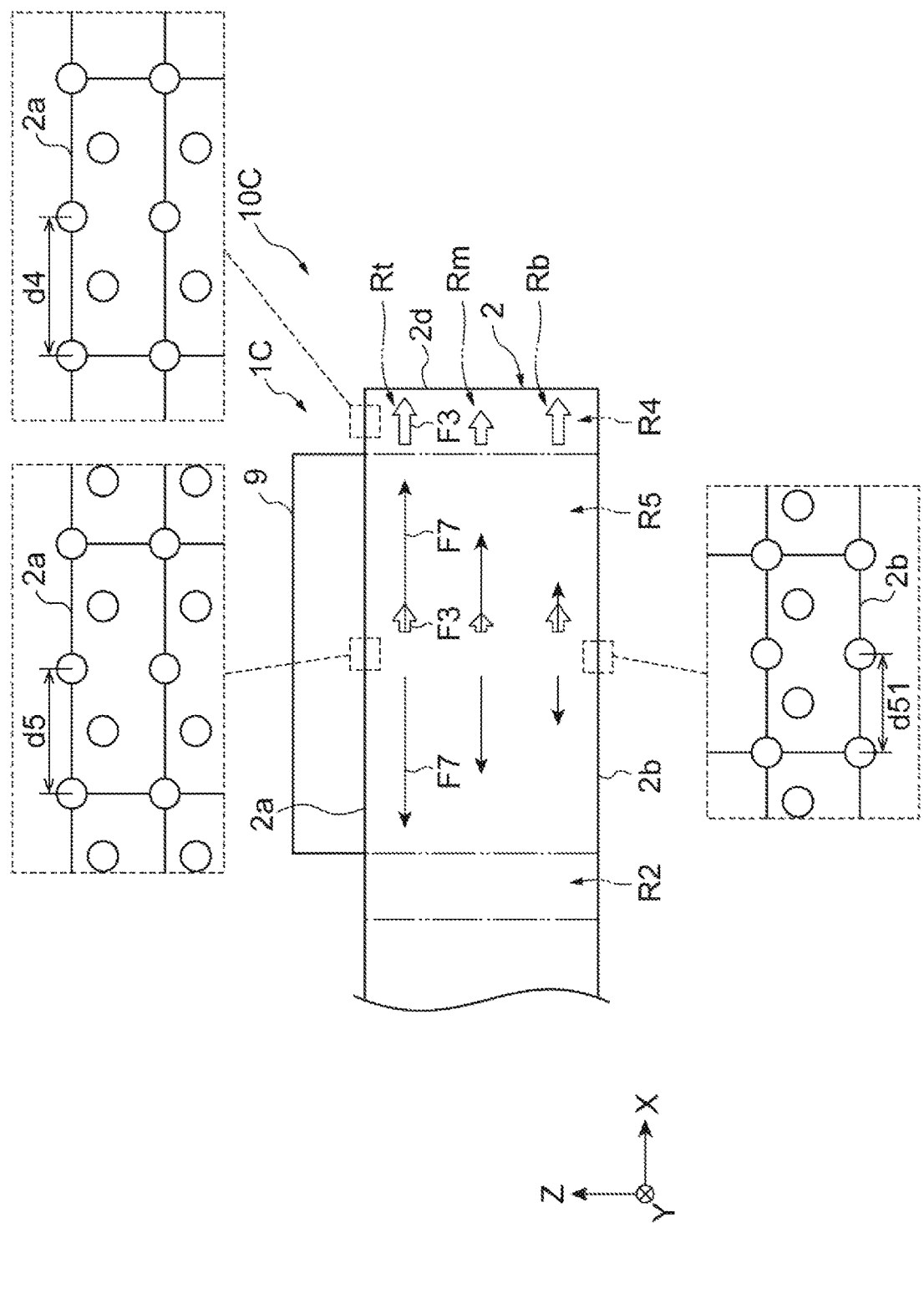
FIG. 7 is a partially enlarged side view of the magnetic sensor shown in FIG. 6.
Figure 8:
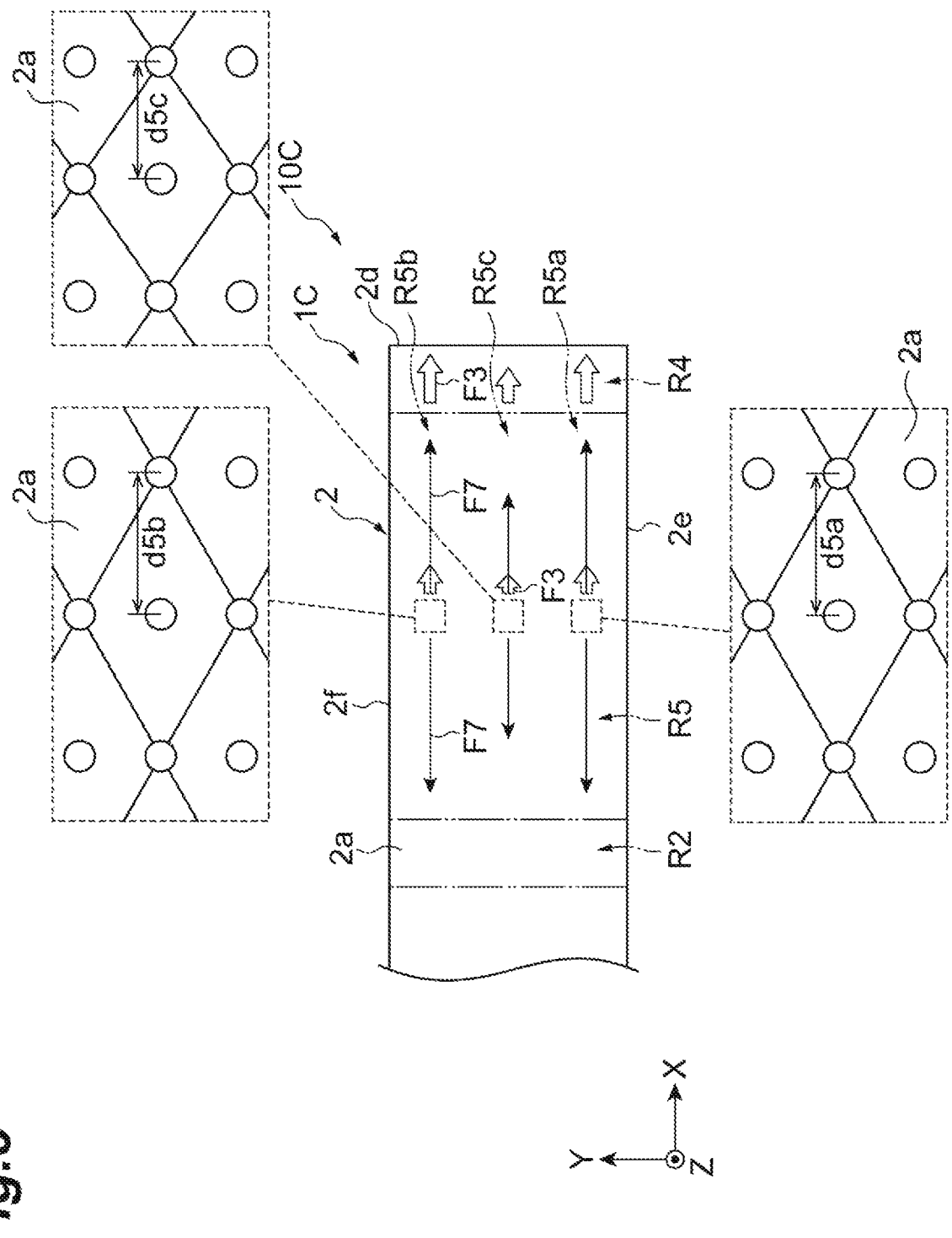
FIG. 8 is a partially enlarged top view of the magnetic sensor shown in FIG. 6.

A magnetoresistance effect element 1C and a magnetic sensor 10C according to a third embodiment will be described with reference to FIGS. 6 to 8 focusing on differences from the magnetoresistance effect element 1A and the magnetic sensor 10A (refer to FIG. 1) according to the first embodiment. FIG. 6 is a perspective view showing a magnetic sensor according to a third embodiment. FIG. 7 is a partially enlarged side view of the magnetic sensor shown in FIG. 6. FIG. 8 is a partially enlarged top view of the magnetic sensor shown in FIG. 6. In FIGS. 6 to 8, an orthogonal coordinate system is shown.

As shown in FIGS. 6 to 8, the magnetic sensor 10C includes the magnetoresistance effect element 1C and is connected to the current source 20 and the voltage measurement unit 30. The magnetoresistance effect element 1C further includes a reference electrode 8, and a fourth protective film 9 in addition to the semiconductor layer 2, the first ferromagnetic layer 3, the second ferromagnetic layer 4, the first insulating layer 5, the second insulating layer 6, the first protective film 7, the second protective film 15 and the third protective film 16. In FIG. 7, illustration other than the semiconductor layer 2 and the fourth protective film 9 is omitted. In FIG. 8, illustration other than the semiconductor layer 2 is omitted.

In the magnetoresistance effect element 1C, the semiconductor layer 2 further includes a fourth region R4 and a fifth region R5 in addition to the first region R1, the second region R2 and the third region R3. Like the first region R1, the second region R2 and the third region R3, each of the fourth region R4 and the fifth region R5 includes a part of the upper surface 2a and a part of the lower surface 2b. In the magnetoresistance effect element 1C, not the second region R2, but the fourth region R4 includes the other end region of each of the upper surface 2a, the lower surface 2b, the side surface 2e and the side surface 2f in the X direction, and the entire side surface 2d. The first region R1, the third region R3, the second region R2, the fifth region R5 and the fourth region R4 are linearly arranged in this order in the X direction. The fifth region R5 is sandwiched between the second region R2 and the fourth region R4 in the X direction as a second direction. The third protective film 16 is provided not to cover the second region R2 but to cover an end portion of the fourth region R4 on the side opposite to the fifth region R5 side in the X direction. The third protective film 16 imparts tensile strain particularly to the fourth region R4 and the fifth region R5 in the X direction, instead of the second region R2 and the third region R3.

Each of the regions R1 to R5 contains the same semiconductor material as the base material. In each of the regions R1 to R5, the crystal orientations of this semiconductor material in at least the X direction are substantially the same. For example, in each of the regions R1 to R5, the crystal orientations of this semiconductor material in at least the X direction can be substantially the same by constituting the entire semiconductor layer 2 with a single crystal. When the entire semiconductor layer 2 is composed of a single crystal, the crystal orientations of the semiconductor material other than the X direction can also be the same in each of the regions R1 to R5. In the embodiment, each of the regions R1 to R5 has n-type conductivity. Further, in each of the regions R1 to R5, the crystal orientations of the semiconductor material in the X direction are substantially [110]. FIG. 7 enlargedly and schematically shows a form of atom arrangement at a plurality of portions of a (110) plane (a (1-10) plane), which is a cross section along an XZ plane, in the semiconductor layer 2. FIG. 8 enlargedly and schematically shows a form of atom arrangement at a plurality of portions of a (001) plane, which is a cross section along an XY plane, in the semiconductor layer 2.

The reference electrode 8 is provided on the upper surface 2a of the semiconductor layer 2 to be spaced apart from the first ferromagnetic layer 3 and the second ferromagnetic layer 4. The reference electrode 8 is in direct contact with the upper surface 2a of the semiconductor layer 2. The reference electrode 8 is provided on the fourth region R4. The reference electrode 8 is provided to cover an upper surface of the fourth region R4 (the other end region of the upper surface 2a in the X direction). A length of the reference electrode 8 in the Y direction is the same as a length of the upper surface 2a in the Y direction. The reference electrode 8 faces the first ferromagnetic layer 3 in the X direction via the second ferromagnetic layer 4.

The reference electrode 8 is composed of a nonmagnetic material such as aluminum. It is possible to reduce a Schottky barrier caused by junction between the reference electrode 8 and the semiconductor layer 2 using a nonmagnetic material having a work function close to a work function of the semiconductor layer 2 as a material of the reference electrode 8. Therefore, it is possible to lower resistance of an interface between the reference electrode 8 and the semiconductor layer 2.

The fourth protective film 9 is provided on the upper surface 2a of the semiconductor layer 2 to be sandwiched between the second ferromagnetic layer 4 and the reference electrode 8 in the X direction. The fourth protective film 9 extends in the X direction to connect the second ferromagnetic layer 4 and the reference electrode 8 to each other. The fourth protective film 9 is provided to cover an upper surface of the fifth region R5. The fourth protective film 9 is in direct contact with the upper surface of the fifth region R5. A length of the fourth protective film 9 in the Y direction is the same as a length of the upper surface 2a in the Y direction.

The fourth protective film 9 is composed of the same material as that of the first protective film 7, for example. Like the first protective film 7, the second protective film 15 and the third protective film 16, the fourth protective film 9 protects the semiconductor layer 2 from deterioration due to oxidation, for example. Like the first protective film 7, the second protective film 15 and the third protective film 16, the fourth protective film 9 also serves as a strain-imparting film which imparts strain to the semiconductor layer 2. The fourth protective film 9 also serves as a strain-imparting film which imparts strain to the fifth region R5. In the embodiment, the fourth protective film 9 imparts tensile strain to the fifth region R5 along the X direction.

In FIGS. 7 and 8, modes of forces F7 applied from the fourth protective film 9 (forces due to the internal stress of the fourth protective film 9) to the semiconductor layer 2 are schematically indicated by solid arrows, and modes of forces F3 applied from the third protective film 16 to the semiconductor layer 2 are schematically indicated by void arrows. These arrows are just images and do not represent exact points of action and magnitudes of the forces. In the embodiment, the fourth protective film 9 has the compressive stress (the force for expanding) as the internal stress. As described above, since the tensile strain along the X direction is applied to each of the fourth region R4 and the fifth region R5, the interatomic distances of the fourth region R4 and the fifth region R5 in the crystal orientation of the semiconductor material in the X direction are larger as compared with the interatomic distance of the fourth region R4 and the fifth region R5 in the crystal orientation of the semiconductor material in the X direction when the tensile strain along the X direction is not applied. In FIG. 7 and FIG. 8, for ease of understanding, the difference between interatomic distances is exaggeratedly shown.

In particular, as shown in FIG. 7, in the fifth region R5, the force F7 applied from the fourth protective film 9 decreases from the upper surface 2a toward the lower surface 2b. In the fifth region R5, the force F3 applied from the third protective film 16 is larger in the upper surface neighboring region Rt and the lower surface neighboring region Rb than in the central region Rm. An amount of change in the force F3 according to a position in the Z direction is much smaller than an amount of change in the force F7 according to the position in the Z direction. Moreover, in the fifth region R5, the force F3 applied from the third protective film 16 is equal in the upper surface neighboring region Rt and the lower surface neighboring region Rb. Therefore, an interatomic distance d5 of the fifth region R5 in the crystal orientation of the semiconductor material in the X direction in the upper surface neighboring region Rt is larger than an interatomic distance d51 of the fifth region R5 in the crystal orientation of the semiconductor material in the X direction in the lower surface near region Rb. In the fourth region R4 and the fifth region R5, the force F2 applied from the second protective film 15 is not shown because it is small in magnitude.

The force F3 applied from the third protective film 16 becomes smaller as being away from the side surface 2d. Each of the forces F7, F2 and F3 is applied to the fifth region R5. In the embodiment, in the upper surface neighboring region Rt, the third protective film 16 and the fourth protective film 9 are formed so that the force F3 applied from the third protective film 16 to the fourth region R4 is larger than a sum of the force F7 applied from the fourth protective film 9 to the fifth region R5 and the force F3 applied from the third protective film 16 to the fifth region R5. Accordingly, in the embodiment, an interatomic distance d4 of the fourth region R4 in the crystal orientation of the semiconductor material in the X direction in the upper surface neighboring region Rt is larger than the interatomic distance d5.

Particularly, as shown in FIG. 8, in the upper surface neighboring region Rt, the fifth region R5 has end regions R5a and R5b in a direction orthogonal to the X direction, that is, in the Y direction, and a central region R5c in the Y direction. The end region R5a is disposed on the side surface 2e side, and the end region R5b is disposed on the side surface 2f side. The force F7 applied from the fourth protective film 9 to the semiconductor layer 2 increases from a center of the fifth region R5 toward the side surfaces 2e and 2f in the Y direction. The force F3 applied from the third protective film 16 to the semiconductor layer 2 also increases from the center of the fifth region R5 toward the side surfaces 2e and 2f in the Y direction. Therefore, an interatomic distance d5a of the end region R5a in the crystal orientation of the semiconductor material in the X direction and an interatomic distance d5b of the end region R5b in the crystal orientation of the semiconductor material in the X direction are larger than an interatomic distance d5c of the central region R5c in the crystal orientation of the semiconductor material in the X direction. The interatomic distance d5a and the interatomic distance d5b are, for example, the same as each other.

The current source 20 is connected to the first ferromagnetic layer 3 and the second ferromagnetic layer 4 and supplies a constant current flowing through the semiconductor layer 2 from the second ferromagnetic layer 4 toward the first ferromagnetic layer 3. The voltage measurement unit 30 is connected to the second ferromagnetic layer 4 and the reference electrode 8 and measures a voltage between the second ferromagnetic layer 4 and the reference electrode 8. The current source 20 may supply a constant current flowing through the semiconductor layer 2 from the first ferromagnetic layer 3 toward the second ferromagnetic layer 4. In this case, the voltage measurement unit 30 is connected to the first ferromagnetic layer 3 and the reference electrode 8, and measures the voltage between the first ferromagnetic layer 3 and the reference electrode 8.

In the magnetic sensor 10C, like the magnetic sensor 10A (refer to FIG. 1), when a current is supplied by the current source 20, the spin-polarized electrons are injected into the semiconductor layer 2 from the first ferromagnetic layer 3. The injected spin-polarized electrons transport through the third region R3, and spins corresponding to the magnetization direction of the first ferromagnetic layer 3 are accumulated mainly in the second region R2 of the upper surface neighboring region Rt. A spin output voltage as a voltage change corresponding to a change in a relative angle between the direction of the spins accumulated in the second region R2 and the magnetization direction of the second ferromagnetic layer 4 is obtained by measuring a voltage between the second ferromagnetic layer 4 and the reference electrode 8 with the voltage measurement unit 30. In this case, the obtained spin output voltage is in principle the same as the spin output voltage obtained by the magnetic sensor 10A. As described above, in addition to the spin output voltage, a voltage including a voltage drop due to a resistance of the semiconductor layer 2, a resistance of the first ferromagnetic layer 3, a resistance of the second ferromagnetic layer 4, a resistance between the first ferromagnetic layer 3 and the semiconductor layer 2 and a resistance between the second ferromagnetic layer 4 and the semiconductor layer 2 is measured in the magnetic sensor 10A. On the other hand, in the magnetic sensor 10C, a voltage which does not include a voltage drop due to the resistance of the semiconductor layer 2, the resistance of the first ferromagnetic layer 3, and the resistance between the first ferromagnetic layer 3 and the semiconductor layer 2 is measured. Therefore, in the magnetic sensor 10C, since resistance of a voltage detection path is lower than that in the magnetic sensor 10A, a high magnetoresistance ratio can be obtained. As a result, a larger SN ratio can be obtained.

Also in the magnetoresistance effect element 1C, the interatomic distance d3 is larger than the interatomic distance d31. Therefore, the same effect as that in the magnetoresistance effect element 1A can be obtained.

Further, in the magnetoresistance effect element 1C, the interatomic distance d5 is larger than the interatomic distance d51. Therefore, an electrical resistance value in the vicinity of the upper surface of the fifth region R5 of the semiconductor layer 2 in the X direction can be reduced as compared with a case in which the interatomic distance d5 is equal to the interatomic distance d51. Since the fifth region R5 is a voltage detection path, output noise can be reduced. As a result, it is possible to obtain a larger SN ratio than the conventional one.

Since the magnetic sensor 10C includes the magnetoresistance effect element 1C, a large SN ratio can be obtained.

Fourth Embodiment

Figure 9:
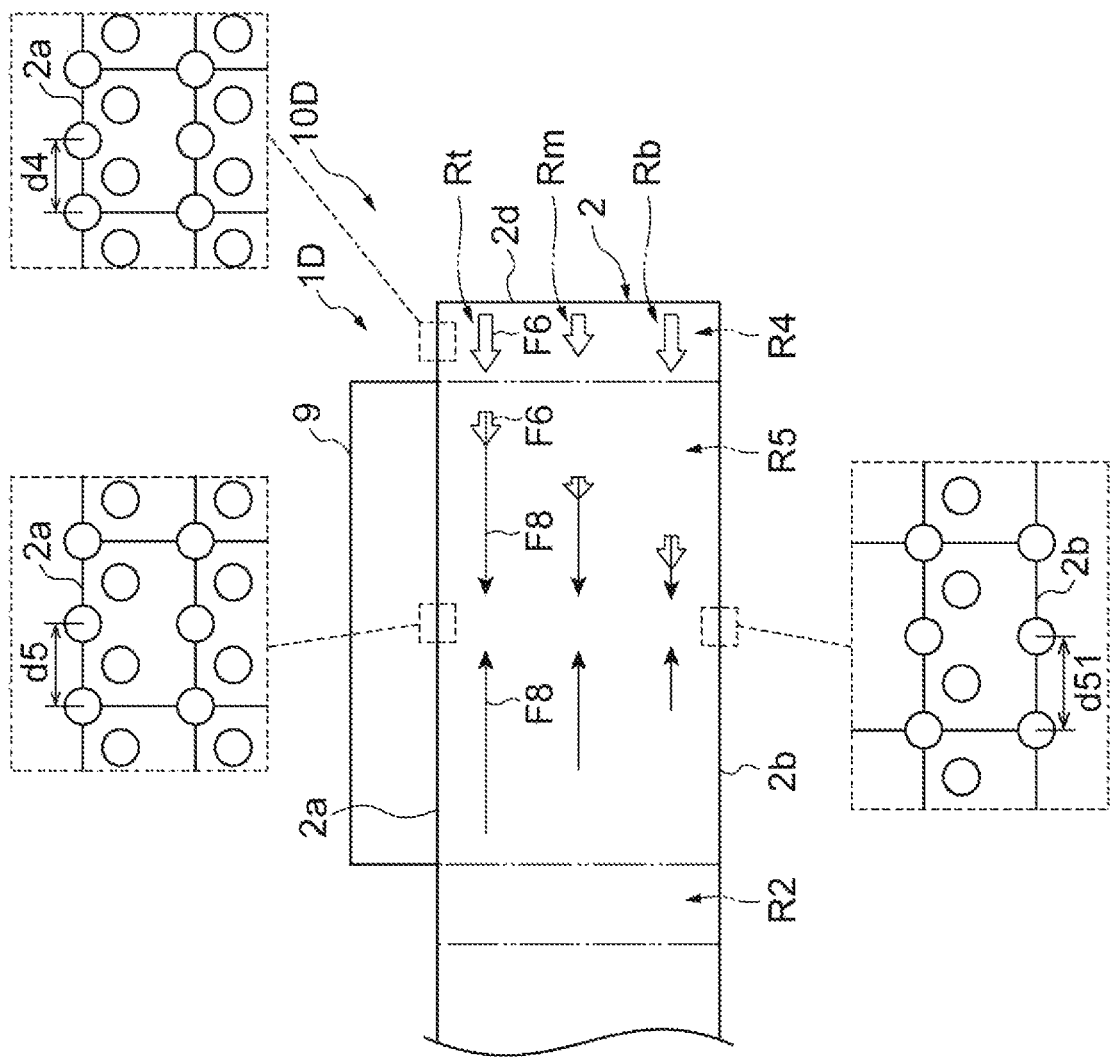
FIG. 9 is a partially enlarged side view showing a magnetic sensor according to a fourth embodiment.
Figure 10:
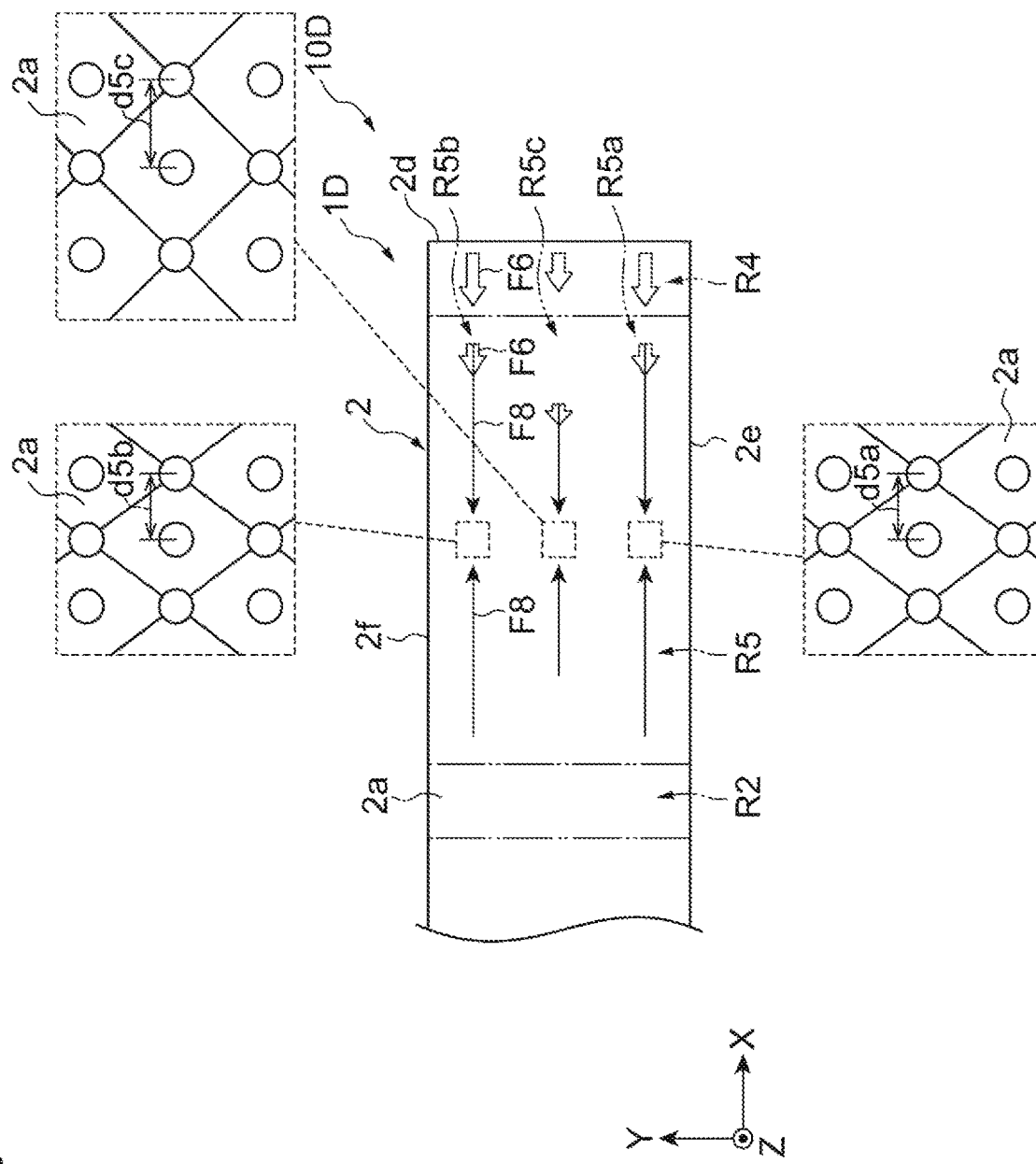
FIG. 10 is a partially enlarged top view showing the magnetic sensor according to the fourth embodiment.

A magnetoresistance effect element 1D and a magnetic sensor 10D according to a fourth embodiment will be described with reference to FIGS. 9 and 10 focusing on differences from the magnetoresistance effect element 1C and the magnetic sensor 10C (refer to FIG. 6) according to the third embodiment. FIG. 9 is a partially enlarged side view showing the magnetic sensor according to the fourth embodiment. FIG. 10 is a partially enlarged top view showing the magnetic sensor according to the fourth embodiment. In FIG. 9, illustration other than the semiconductor layer 2 and the fourth protective film 9 is omitted. In FIG. 10, illustration other than the semiconductor layer 2 is omitted. In FIGS. 9 and 10, an orthogonal coordinate system is shown. FIG. 9 enlargedly and schematically shows a form of atom arrangement at a plurality of portions of a (110) plane (a (1-10) plane), which is a cross section along an XZ plane, in the semiconductor layer 2. FIG. 10 enlargedly and schematically shows a form of atom arrangement at a plurality of portions of a (001) plane, which is a cross section along an XY plane, in the semiconductor layer 2.

In the magnetoresistance effect element 1D shown in FIGS. 9 and 10, as in the magnetoresistance effect element 1B shown in FIGS. 4 and 5, the semiconductor layer 2 has p-type conductivity instead of n-type conductivity. That is, in addition to the first region R1, the second region R2 and the third region R3, the fourth region R4 and the fifth region R5 have p-type conductivity instead of n-type conductivity. Further, as in the magnetoresistance effect element 1B, the first protective film 7 imparts the compressive strain to the third region R3 along the X direction. The third protective film 16 imparts the compressive strain particularly to the fourth region R4 and the fifth region R5 along the X direction. The force F4 applied from the first protective film 7 (the force due to the internal stress of the first protective film 7) to the semiconductor layer 2 decreases from the upper surface 2a toward the lower surface 2b. Therefore, the interatomic distance d3 is smaller than the interatomic distance d31. The force applied from the first protective film 7 to the semiconductor layer 2 increases from the center of the third region R3 in the Y direction toward the side surfaces 2e and 2f. Thus, the interatomic distance d3a and the interatomic distance d3b are smaller than the interatomic distance d3c of the central region R3c. In FIG. 9 and FIG. 10, for ease of understanding, the difference between the interatomic distances is exaggeratedly shown.

The fourth protective film 9 imparts the compressive strain to the fifth region R5 along the X direction. In FIGS. 9 and 10, modes of forces F8 applied from the fourth protective film 9 to the semiconductor layer 2 are schematically indicated by solid arrows, and modes of the forces F6 applied from the third protective film 16 to the semiconductor layer 2 are schematically indicated by void arrows. These arrows are just images and do not represent an exact points of action and magnitudes of the force. In the embodiment, the first protective film 7 and the fourth protective film 9 have the tensile stress (the force for contracting) as the internal stress, and the second protective film 15 and the third protective film 16 have the compressive stresses (the forces for expanding) as the internal stresses. As described above, since the compressive strain along the X direction is applied to each of the fourth region R4 and the fifth region R5, the interatomic distances of the fourth region R4 and the fifth region R5 in the crystal orientation of the semiconductor material in the X direction are smaller as compared with the interatomic distances of the fourth region R4 and the fifth region R5 in the crystal orientation of the semiconductor material in the X direction when the compressive strain along the X direction is not applied.

In particular, as shown in FIG. 9, in the fifth region R5, the force F8 applied from the fourth protective film 9 decreases from the upper surface 2a toward the lower surface 2b. In the fifth region R5, the force F6 applied from the third protective film 16 is larger in the upper surface neighboring region Rt and the lower surface neighboring region Rb than in the central region Rm. An amount of change in the force F6 according to a position in the Z direction is much smaller than an amount of change in the force F8 according to the position in the Z direction. Moreover, in the fifth region R5, the force F6 applied from the third protective film 16 is equal in the upper surface neighboring region Rt and the lower surface neighboring region Rb. Therefore, the interatomic distance d5 is smaller than the interatomic distance d51. In the fourth region R4 and the fifth region R5, the force F5 applied from the second protective film 15 is not shown because it is small in magnitude.

The force F6 applied from the third protective film 16 becomes smaller as being away from the side surface 2d. Each of the forces F5, F6 and F8 is applied to the fifth region R5. In the embodiment, in the upper surface neighboring region Rt, the third protective film 16 and the fourth protective film 9 are formed so that the force F6 applied from the third protective film 16 to the fourth region R4 is larger than a sum of the force F8 applied from the fourth protective film 9 to the fifth region R5 and the force F6 applied from the third protective film 16 to the fifth region R5. Accordingly, in the embodiment, an interatomic distance d4 is smaller than the interatomic distance d5.

In particular, as shown in FIG. 10, the force F8 applied from the fourth protective film 9 to the semiconductor layer 2 increases from the center of the fifth region R5 toward the side surfaces 2e and 2f in the Y direction. The force F6 applied from the third protective film 16 to the semiconductor layer 2 also increases from the center of the fifth region R5 toward the side surfaces 2e and 2f in the Y direction. Therefore, the interatomic distance d5a and the interatomic distance d5b are smaller than the interatomic distance d5c.

In the magnetic sensor 10D, as in the magnetic sensor 10B according to the second embodiment (refer to FIG. 4), when a current is supplied by the current source 20, the spin-polarized holes are injected from the first ferromagnetic layer 3 into the semiconductor layer 2. The injected spin-polarized holes transport through the third region R3, and the spins corresponding to the magnetization direction of the first ferromagnetic layer 3 are accumulated mainly in the second region R2 in the upper surface neighboring region Rt. A spin output voltage as a voltage change corresponding to a change in a relative angle between the direction of the spins accumulated in the second region R2 and the magnetization direction of the second ferromagnetic layer 4 is obtained by measuring a voltage between the second ferromagnetic layer 4 and the reference electrode 8 with the voltage measurement unit 30. In this case, the obtained spin output voltage is in principle the same as the spin output voltage obtained by the magnetic sensor 10B. As described above, in addition to the spin output voltage, a voltage including a voltage drop due to the resistance of the semiconductor layer 2, the resistance of the first ferromagnetic layer 3, the resistance of the second ferromagnetic layer 4, the resistance between the first ferromagnetic layer 3 and the semiconductor layer 2, and the resistance between the second ferromagnetic layer 4 and the semiconductor layer 2 is measured in the magnetic sensor 10B. On the other hand, in the magnetic sensor 10D, a voltage which does not include a voltage drop due to the resistance of the semiconductor layer 2, the resistance of the first ferromagnetic layer 3, and the resistance between the first ferromagnetic layer 3 and the semiconductor layer 2 is measured. Therefore, in the magnetic sensor 10D, since the resistance of the voltage detection path is lower than that in the magnetic sensor 10B, a high magnetoresistance ratio can be obtained. As a result, a larger SN ratio can be obtained.

Also in the magnetoresistance effect element 1D, the interatomic distance d3 is smaller than the interatomic distance d31. Therefore, the same effect as that in the magnetoresistance effect element 1B can be obtained.

Further, in the magnetoresistance effect element 1D, the interatomic distance d5 is smaller than the interatomic distance d51. Therefore, an electrical resistance value of the upper surface neighboring region Rt of the fifth region R5 of the semiconductor layer 2 in the X direction can be reduced as compared with the case in which the interatomic distance d5 is equal to the interatomic distance d51. Since the fifth region R5 is a voltage detection path, the output noise can be reduced. As a result, it is possible to obtain a larger SN ratio than the conventional one.

Since the magnetic sensor 10D includes the magnetoresistance effect element 1D, a large SN ratio can be obtained.

Fifth Embodiment

Figure 11:
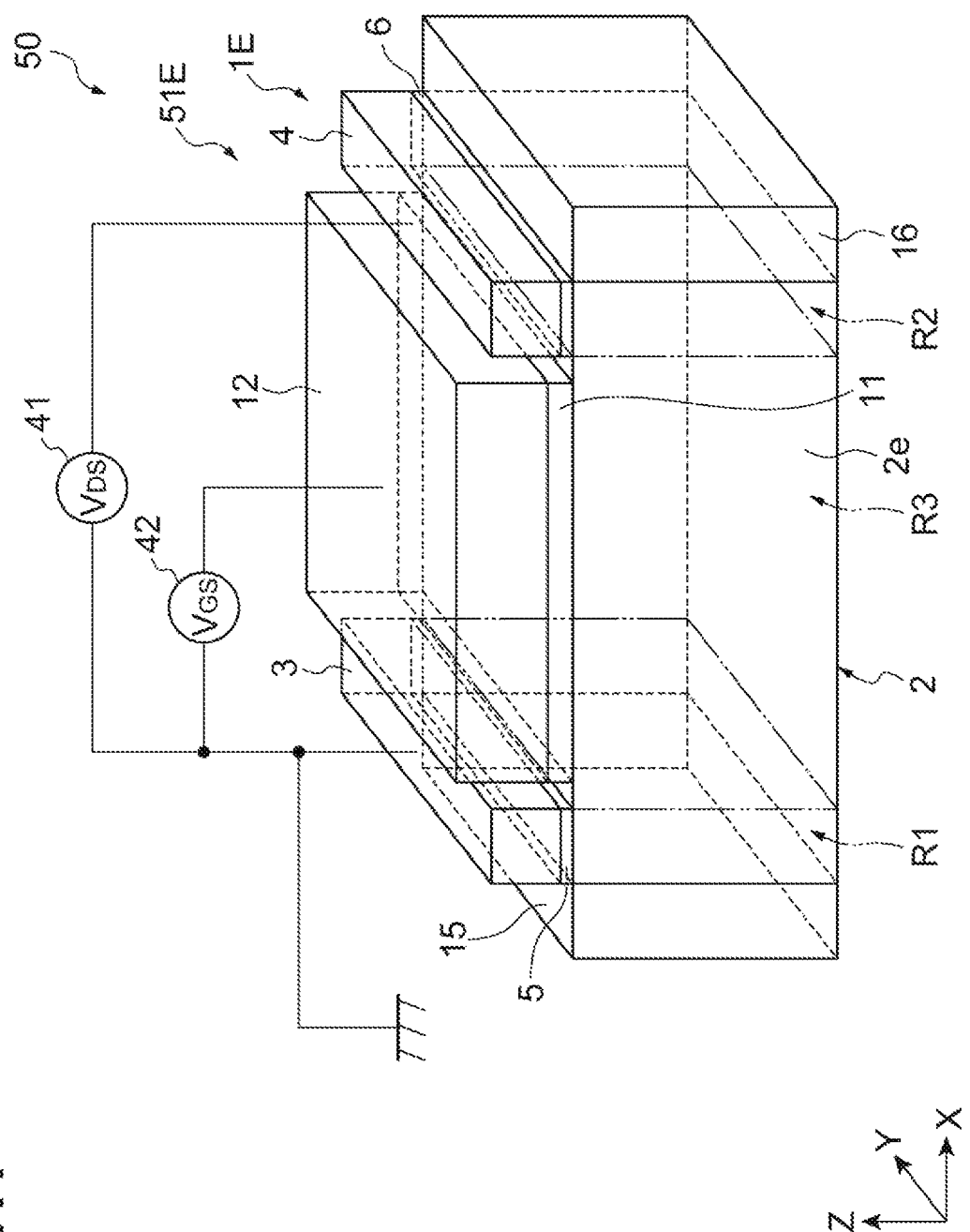
FIG. 11 is a perspective view showing a spin transistor according to a fifth embodiment.
Figure 12:
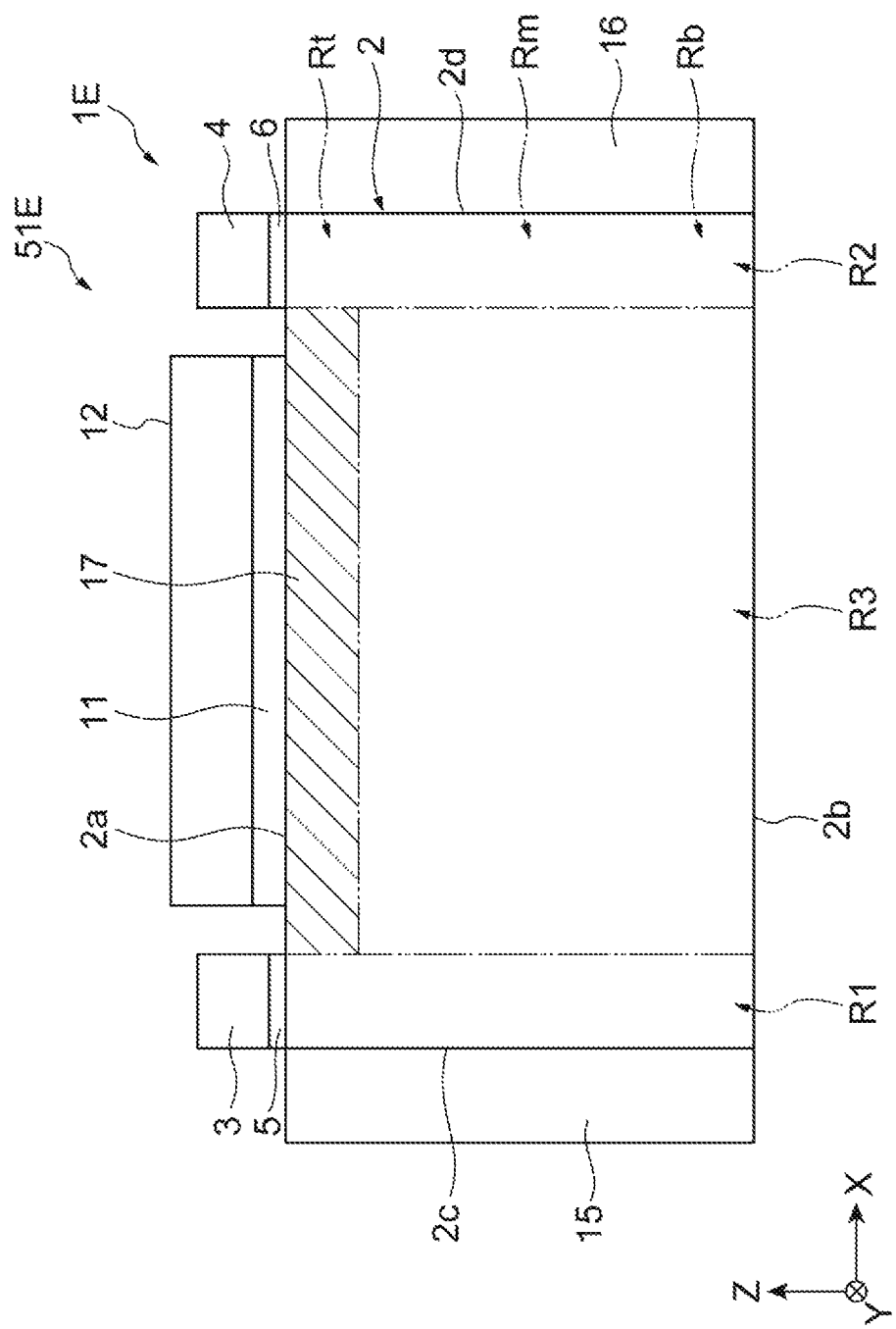
FIG. 12 is a cross-sectional view showing a carrier control type magnetoresistance effect element shown in FIG. 11.

A magnetoresistance effect element 1E and a spin transistor 50 according to a fifth embodiment will be described with reference to FIGS. 11 and 12. FIG. 11 is a perspective view showing the spin transistor according to the fifth embodiment. FIG. 12 is a cross-sectional view showing a carrier control type magnetoresistance effect element shown in FIG. 11. In FIGS. 11 to 12, an orthogonal coordinate system is shown. As shown in FIGS. 11 to 12, the spin transistor 50 includes a magnetoresistance effect element 1E, a third insulating layer 11, and a gate electrode 12, and is connected to a power supply 41 and a power supply 42. The magnetoresistance effect element 1E, the third insulating layer 11 and the gate electrode 12 constitute a carrier control type magnetoresistance effect element 51E. The magnetoresistance effect element 1E includes the semiconductor layer 2, the first ferromagnetic layer 3, the second ferromagnetic layer 4, the first insulating layer 5, the second insulating layer 6, the second protective film 15, and the third protective film 16. The semiconductor layer 2 has the first region R1, the second region R2, and the third region R3, as in the case of the magnetoresistance effect element 1A (refer to FIG. 1).

The third insulating layer 11 is provided on the third region R3. The third insulating layer 11 is in direct contact with the upper surface of the third region R3. The third insulating layer 11 is provided between the first ferromagnetic layer 3 and the second ferromagnetic layer 4 to be spaced apart from the first ferromagnetic layer 3 and the second ferromagnetic layer 4. A length of the third insulating layer 11 in the Y direction is the same as a length of the upper surface 2a in the Y direction. For example, the third insulating layer 11 has an oxide insulator such as a silicon oxide, a hafnium oxide, a zirconium oxide, an aluminum oxide, a lanthanum oxide, an yttrium oxide or a magnesium oxide, or a nitride insulator such as an aluminum nitride or a silicon nitride. The third insulating layer 11 also serves as a strain imparting film which imparts strain to the third region R3. The third insulating layer 11 imparts strain to the third region R3 along the X direction. The gate electrode 12 is provided on the third region R3 with the third insulating layer 11 interposed therebetween. The gate electrode 12 is provided to be spaced apart from the first ferromagnetic layer 3 and the second ferromagnetic layer 4. For example, a metal, an alloy or a conductive nitride having an element such as Pt, W, Ta, Ti, Al or the like can be used as an electrode material constituting the gate electrode 12. Also, polycrystalline silicon, silicide, germanide or the like can be used. The gate electrode 12 is configured to be capable of applying a voltage such that an inversion layer 17 is formed in at least a part of the upper surface neighboring region Rt of the third region R3.

In the magnetoresistance effect element 1E, doping of an impurity to the semiconductor layer 2 is selectively performed. Therefore, there is a difference in carrier concentration in the semiconductor layer 2. Specifically, the carrier concentration in the first region R1 and the second region R2 is higher than the carrier concentration in the third region R3. That is, the first region R1 and the second region R2 are heavily doped regions, and the third region R3 is a lightly doped region. The first region R1 and the second region R2 have the same conductivity type.

In the case in which the first region R1 and the second region R2 have the n-type conductivity and the third region R3 has the n-type conductivity, the carrier control type magnetoresistance effect element 51E constitutes an NNN type spin MOSFET. In the case in which the first region R1 and the second region R2 have the n-type conductivity and the conductivity type of the third region R3 when a voltage is not applied to the gate electrode 12 is p-type, the carrier control type magnetoresistance effect element 51E constitutes an NPN type spin MOSFET. In the case in which the first region R1 and the second region R2 have the p-type conductivity and the conductivity type of the third region R3 when the voltage is not applied to the gate electrode 12 is the n-type, the carrier control type magnetoresistance effect element 51E constitutes a PNP type spin MOSFET. In the case in which the first region R1 and the second region R2 have the p-type conductivity and the third region R3 has the p-type conductivity, the carrier control type magnetoresistance effect element 51E constitutes a PPP type spin MOSFET.

One of the first ferromagnetic layer 3 and the second ferromagnetic layer 4 serves as a source electrode, and the other one of the first ferromagnetic layer 3 and the second ferromagnetic layer 4 serves as a drain electrode. In the embodiment, the first ferromagnetic layer 3 serves as a source electrode, and the second ferromagnetic layer 4 serves as a drain electrode. The power supply 41 is connected to the first ferromagnetic layer 3 and the second ferromagnetic layer 4. The power supply 42 is connected to the ground and the gate electrode 12. The first ferromagnetic layer 3 is connected to the ground.

In the carrier control type magnetoresistance effect element 51E, it is possible to control the conductivity type and the carrier density of the third region R3 by applying a voltage to the gate electrode 12 by the power supply 42.

In the case in which the carrier control type magnetoresistance effect element 51E constitutes the NNN type spin MOSFET, when a positive voltage is applied to the second ferromagnetic layer 4 by the power supply 41, even without applying a voltage to the gate electrode 12, the spin-polarized electrons are injected from the first ferromagnetic layer 3 into the semiconductor layer 2 and flow through the third region R3 toward the second ferromagnetic layer 4. When a positive voltage is applied to the gate electrode 12 by the power supply 42, the carrier density in the vicinity of the upper surface of the third region R3 increases, and thus the spin-polarized electrons easily flow. When a negative voltage is applied to the gate electrode 12 by the power supply 42, the carrier density in the vicinity of the upper surface of the third region R3 decreases, and thus the spin-polarized electrons hardly flow In the case in which the carrier control type magnetoresistance effect element 51E constitutes the NPN type spin MOSFET, when a positive voltage is applied to the gate electrode 12 by the power supply 42, the inversion layer 17 having the n-type conductivity is formed in the third region R3 of the upper surface neighboring region Rt. Therefore, when a positive voltage is applied to the second ferromagnetic layer 4 by the power supply 41, the spin-polarized electrons are injected from the first ferromagnetic layer 3 into the semiconductor layer 2 and transport or diffuse through the third region R3 toward the second ferromagnetic layer 4. On the other hand, in a state in which no voltage is applied to the gate electrode 12 or a state in which a negative voltage is applied, a high-resistance depletion layer is formed at an interface between the first region R1 and the second region R2 and the third region R3, and thus even when a voltage is applied to the second ferromagnetic layer 4 by the power supply 41, the spin-polarized electrons hardly flow.

In the case in which the carrier control type magnetoresistance effect element 51E constitutes the PNP type spin MOSFET, when a negative voltage is applied to the gate electrode 12 by the power supply 42, the inversion layer 17 having the p-type conductivity is formed in the third region R3 of the upper surface neighboring region Rt. Therefore, when a negative voltage is applied to the second ferromagnetic layer 4 by the power supply 41, the spin-polarized holes are injected from the first ferromagnetic layer 3 into the semiconductor layer 2 and transport or diffuse through the third region R3 toward the second ferromagnetic layer 4. On the other hand, in a state in which no voltage is applied to the gate electrode 12 or a positive voltage is applied, the high-resistance depletion layer is formed at the interface between the first region R1 and the second region R2 and the third region R3, and thus even when a voltage is applied to the second ferromagnetic layer 4 by the power supply 41, the spin-polarized holes hardly flow.

In the case in which the carrier control type magnetoresistance effect element 51E constitutes the PPP type spin MOSFET, when a negative voltage is applied to the second ferromagnetic layer 4 by the power supply 41, even without applying a voltage to the gate electrode 12, the spin-polarized holes are injected from the first ferromagnetic layer 3 into the semiconductor layer 2 and flows through the third region R3 toward the second ferromagnetic layer 4. When a negative voltage is applied to the gate electrode 12 by the power supply 42, the carrier density in the vicinity of the upper surface of the third region R3 increases, and thus the spin-polarized holes easily flow. When a positive voltage is applied to the gate electrode 12 by the power supply 42, the carrier density in the vicinity of the upper surface of the third region R3 decreases, and thus the spin-polarized holes hardly flow.

When the carrier control type magnetoresistance effect element 51E constitutes the NNN type and NPN type spin MOSFETs, a region in which the spins transport and/or diffuse has the n-type conductivity. In this case, the second protective film 15, the third protective film 16 and the third insulating layer 11 impart the tensile strain to the third region R3, and the interatomic distances d1, d2, d3, d31, d3a, d3b and d3c have the same relationship as that in the magnetoresistance effect element 1A (refer to FIG. 1). Therefore, in the carrier control type magnetoresistance effect element 51E (the magnetoresistance effect element 1E), the same effect as in the case of the magnetoresistance effect element 1A can be obtained.

When the carrier control type magnetoresistance effect element 51E constitutes the PNP type and PPP type spin MOSFETs, a region in which the spins transport and/or diffuse has the p-type conductivity. In this case, the second protective film 15, the third protective film 16 and the third insulating layer 11 impart the compressive strain to the third region R3, and the interatomic distances d1, d2, d3, d31, d3a, d3b and d3c have the same relationship as that in the magnetoresistance effect element 1B (refer to FIG. 4). Therefore, in the carrier control type magnetoresistance effect element 51E (the magnetoresistance effect element 1E), the same effect as in the case of the magnetoresistance effect element 1B can be obtained.

When the first region R1 and the second region R2 have the same conductivity type as that of the third region R3, that is, when the carrier control type magnetoresistance effect element 51E constitutes the NNN type or PPP type spin MOSFET, a normally-on type (depletion type) spin transistor 50 in which a spin-polarized current flows without applying a voltage to the gate electrode 12 can be realized. When the first region R1 and the second region R2 have conductivity types different from that of the third region R3, that is, when the carrier control type magnetoresistance effect element 51E constitutes the NPN type or PNP type spin MOSFET, a normally-off type (enhancement type) spin transistor 50 in which a spin-polarized current does not flow unless a voltage is applied to the gate electrode 12 can be realized.

Sixth Embodiment

Figure 13:
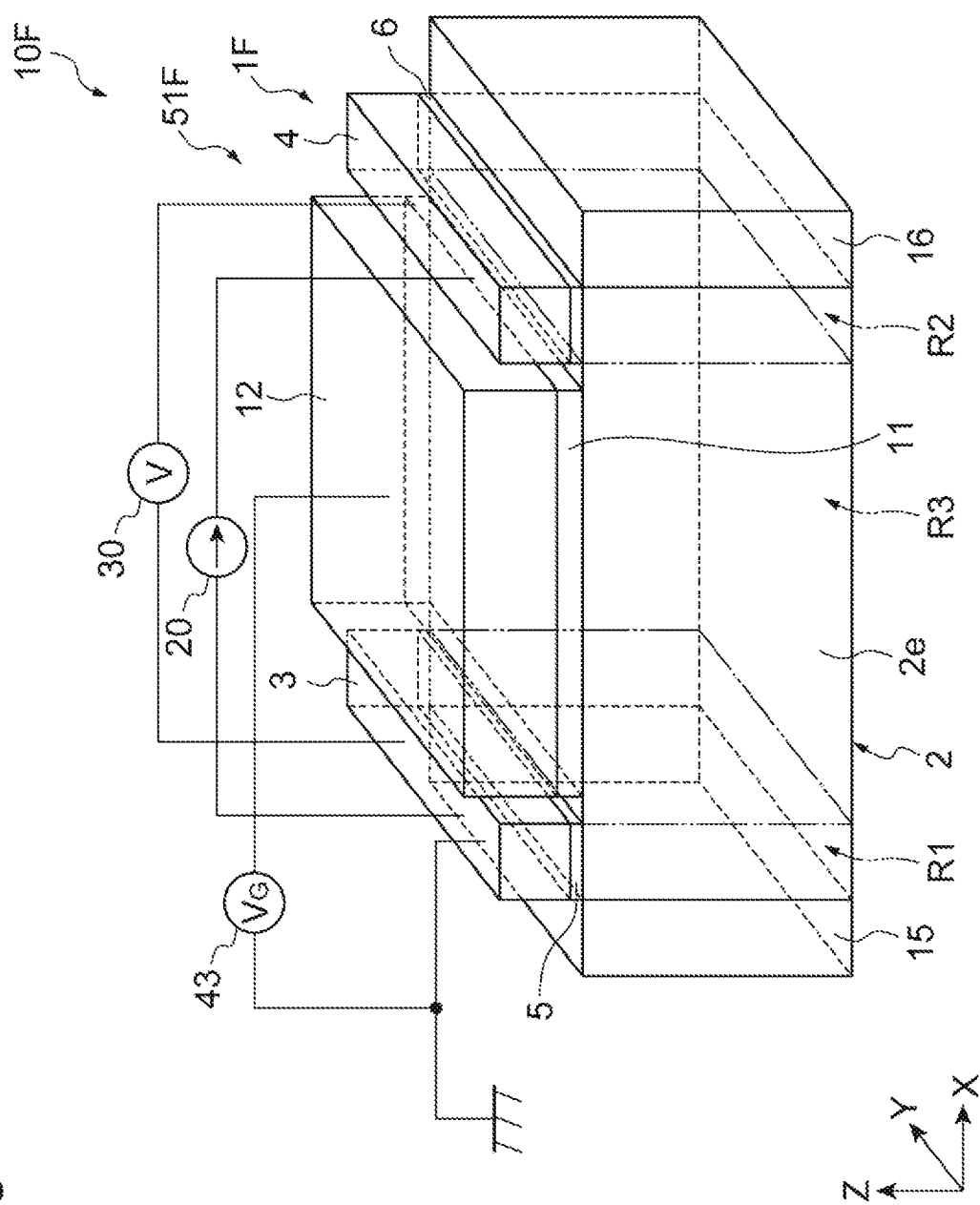
FIG. 13 is a perspective view showing a magnetic sensor according to a sixth embodiment.

The magnetoresistance effect element 1F and the magnetic sensor 10F according to a sixth embodiment will be described with reference to FIG. 13. FIG. 13 is a perspective view showing a magnetic sensor according to a sixth embodiment. In FIG. 13, an orthogonal coordinate system is shown. As shown in FIG. 13, the magnetic sensor 10F includes the magnetoresistance effect element 1F and is connected to the current source 20, the voltage measurement unit 30, and a power supply 43. The magnetoresistance effect element 1F has the same configuration as that of the magnetoresistance effect element 1E (refer to FIG. 11). The third insulating layer 11 and the gate electrode 12 have the same configurations as the third insulating layer 11 and the gate electrode 12 (refer to FIG. 11) according to the fifth embodiment. The magnetoresistance effect element 1F, the third insulating layer 11 and the gate electrode 12 constitute a carrier control type magnetoresistance effect element 51F. The carrier control type magnetoresistance effect element 51F has the same configuration as the carrier control type magnetoresistance effect element 51E (refer to FIG. 11). The current source 20 supplies a constant current flowing through the semiconductor layer 2 from the second ferromagnetic layer 4 toward the first ferromagnetic layer 3. The voltage measurement unit 30 is connected to the first ferromagnetic layer 3 and the second ferromagnetic layer 4 and measures a voltage between the first ferromagnetic layer 3 and the second ferromagnetic layer 4. The power supply 43 is connected to the ground and the gate electrode 12. The first ferromagnetic layer 3 is connected to the ground.

According to the carrier control type magnetoresistance effect element 51F, like the carrier control type magnetoresistance effect element 51E (refer to FIG. 11), it is possible to control the conductivity type and the carrier density of the third region R3 by applying an electric field to the gate electrode 12 by the power supply 43.

Since the magnetic sensor 10F includes the carrier control type magnetoresistance effect element 51F, a large SN ratio can be obtained. Also, in the magnetic sensor 10F, the conductivity type and the carrier density of the third region R3 can be controlled. Therefore, for example, in the upper surface neighboring region Rt, a spin accumulation effect in the semiconductor layer 2 can be increased by applying a voltage to the gate electrode 12 so that the carrier density in the third region R3 increases. Thus, the magnetoresistance effect can be increased. As a result, since the output signal can be increased, a large SN ratio can be obtained.

The present disclosure is not limited to the above-described embodiments.

In the magnetoresistance effect elements 1A, 1B, 1C and 1D, the first protective film 7 serves as the strain imparting film depending on the film deposition conditions of the first protective film 7, but the first protective film 7 may serve as a strain imparting film using a difference between a thermal expansion coefficient of the first protective film 7 and a thermal expansion coefficient of the semiconductor layer 2. For example, a material having a thermal expansion coefficient higher than the thermal expansion coefficient of the semiconductor layer 2 is used as a material of the first protective film 7, and the first protective film 7 is formed on the third region R3 at a high temperature. In this case, when the temperature is lowered from a high temperature to a normal temperature, a contraction amount of the first protective film 7 is larger than a contraction amount of the semiconductor layer 2. As a result, the tensile stress (the force for contracting) remains in the first protective film 7. Further, for example, a material having a thermal expansion coefficient smaller than the thermal expansion coefficient of the semiconductor layer 2 is used as the material of the first protective film 7, and the first protective film 7 is formed on the third region R3 at a high temperature. In this case, the contraction amount of the first protective film 7 is smaller than the contraction amount of the semiconductor layer 2 when the temperature is lowered from a high temperature to a normal temperature. As a result, the compressive stress (the force for expanding) remains in the first protective film 7.

Further, for example, a material having a thermal expansion coefficient larger than the thermal expansion coefficient of the semiconductor layer 2 is used as the material of the first protective film 7, and the first protective film 7 is formed on the third region R3 at a low temperature equal to or less than room temperature. In this case, when the temperature is raised from the low temperature, an expansion amount of the first protective film 7 is larger than an expansion amount of the semiconductor layer 2. As a result, the compressive stress (the force for expanding) remains in the first protective film 7. Further, for example, a material having a thermal expansion coefficient smaller than the thermal expansion coefficient of the semiconductor layer 2 is used as a material of the first protective film 7, and the first protective film 7 is formed on the third region R3 at the low temperature equal to or less than the room temperature. In this case, when the temperature is raised from the low temperature, the expansion amount of the first protective film 7 is smaller than the expansion amount of the semiconductor layer 2. As a result, the tensile stress (the force for contracting) remains in the first protective film 7. Strain can be imparted to the third region R3 using the force provided from the first protective film 7 (the force due to the internal stress of the first protective film 7) as described above.

Specific examples of combinations of materials of the semiconductor layer 2 and the first protective film 7 are shown in Tables 1 and 2. Table 1 shows a case in which the first protective film 7 has the compressive stress as the internal stress. Table 2 shows a case in which the first protective film 7 has the tensile stress as the internal stress.

TABLE 1

| | Protective film having compressive stress as internal stress | |
|---|---|---|
| Semiconductor layer | Film deposition at higher temperature than room temperature | Film deposition at lower temperature than room temperature |
| Silicon | Silicon oxide | Zirconium oxide, magnesium oxide, aluminum oxide, yttrium oxide, hafnium oxide, aluminum nitride, silicon nitride |
| Germanium | Silicon oxide, silicon nitride, aluminum nitride, hafnium oxide | Zirconium oxide, magnesium oxide, aluminum oxide, yttrium oxide |
| Carbon (diamond) | Silicon oxide | Zirconium oxide, magnesium oxide, aluminum oxide, yttrium oxide, hafnium oxide, aluminum nitride, silicon nitride |

TABLE 2

| | Protective film having tensile stress as internal stress | |
|---|---|---|
| Semiconductor layer | Film deposition at higher temperature than room temperature | Film deposition at lower temperature than room temperature |
| Silicon | Zirconium oxide, magnesium oxide, aluminum oxide, yttrium oxide, hafnium oxide, aluminum nitride, silicon nitride | Silicon oxide |
| Germanium | Zirconium oxide, magnesium oxide, aluminum oxide, yttrium oxide | Silicon oxide, silicon nitride, aluminum nitride, hafnium oxide |
| Carbon (diamond) | Zirconium oxide, magnesium oxide, aluminum oxide, yttrium oxide, hafnium oxide, aluminum nitride, silicon nitride | Silicon oxide |

In the magnetoresistance effect elements 1A, 1B, 1C, 1D, 1E and 1F, the second protective film 15 and the third protective film 16 may serve as the strain imparting film using the difference between the thermal expansion coefficient of the second protective film 15 and the third protective film 16 and the thermal expansion coefficient of the semiconductor layer 2. Specific examples of combinations of the materials of the semiconductor layer 2, the second protective film 15 and the third protective film 16 can be the same as the specific examples of the combinations of the materials of the semiconductor layer 2 and the first protective film 7 shown in Tables 1 and 2.

In the magnetoresistance effect elements 1C and 1D, the fourth protective film 9 may serve as the strain imparting film using the difference between the thermal expansion coefficient of the fourth protective film 9 and the thermal expansion coefficient of the semiconductor layer 2. Specific examples of combinations of the materials of the semiconductor layer 2 and the fourth protective film 9 can be the same as the specific examples of the combinations of the materials of the semiconductor layer 2 and the first protective film 7 shown in Tables 1 and 2. In the carrier control type magnetoresistance effect elements 51E and 51F, the third insulating layer 11 may serve as the strain imparting film using the difference between the thermal expansion coefficient of the third insulating layer 11 and the thermal expansion coefficient of the semiconductor layer 2. Specific examples of combinations of the materials of the semiconductor layer 2 and the third insulating layer 11 can be the same as the specific examples of the combinations of the materials of the semiconductor layer 2 and the first protective film 7 shown in Tables 1 and 2.

The magnetoresistance effect elements 1A, 1B, 1C and 1D have the first protective film 7 which imparts the strain to the third region R3, but the first protective film 7 may not be provided as long as the strain introduced into the third region R3 by the first protective film 7 or the like remains and the relationship between the above-described interatomic distances is maintained. The magnetoresistance effect elements 1A, 1B, 1C, 1D, 1E and 1F have the second protective film 15 and the third protective film 16 which impart the strain to the third region R3 or the like, but the second protective film 15 and the third protective film 16 may not be provided as long as the strain introduced into the third region R3 or the like by the second protective film 15 and the third protective film 16 or the like remains and the relationship between the above-described interatomic distances is maintained. The magnetoresistance effect elements 1C and 1D have the fourth protective film 9 which imparts the strain to the fifth region R5, but the fourth protective film 9 may not be provided as long as the strain introduced into the fifth region R5 by the fourth protective film 9 or the like remains and the relationship between the above-described interatomic distances is maintained.

In the carrier control type magnetoresistance effect elements 51E and 51F, the third insulating layer 11 imparts the strain to the third region R3 along the X direction, but the third insulating layer 11 may not serve as the strain imparting film. For example, before the formation of the third insulating layer 11, a strain imparting film which is not the third insulating layer 11 may be formed on the third region R3 and then may introduce the strain into the third region R3. In this case, the third insulating layer 11 can be formed in a state in which the film is removed and the strain remains in the third region R3. Further, for example, the carrier control type magnetoresistance effect elements 51E and 51F may include a protective film provided to cover the upper surface of the gate electrode 12, and the protective film may serve as the strain imparting film.

In the magnetoresistance effect elements 1C and 1D, the fifth region R5 is sandwiched between the second region R2 and the fourth region R4 in the X direction, and the first region R1, the third region R3, the second region R2, the fifth region R5 and the fourth region R4 are linearly arranged in this order in the X direction (that is, the first direction and the second direction coincide with each other), but the present disclosure is not limited thereto. The first direction and the second direction may be different from each other, and for example, the fifth region R5 may be sandwiched between the second region R2 and the fourth region R4 in a direction intersecting the X direction, and the direction in which the first region R1, the third region R3 and the second region R2 are arranged and the direction in which the second region R2, the fifth region R5 and the fourth region R4 are arranged may intersect each other. In this case, the magnetoresistance effect elements 1C and 1D have a bent shape as a whole. The magnetoresistance effect elements 1C and 1D may have a curved shape as a whole.

The magnetoresistance effect elements 1A, 1B, 1C, 1D, 1E and 1F may not have the first insulating layer 5 and the second insulating layer 6.

In the magnetoresistance effect elements 1C and 1D, like the magnetoresistance effect element 1F, the third insulating layer 11 and the gate electrode 12 may be provided on the third region R3 instead of the first protective film 7. In this case, the magnetic sensors 10C and 10D may be connected to the power supply 43 which applies a voltage to the gate electrode 12, as in the magnetic sensor 10F. Thus, it is possible to control the conductivity type and the carrier density of the third region R3.

In the magnetic sensors 10A, 10B, 10C, 10D and 10F, a voltage source may be used instead of the current source 20, and a current measurement unit may be used instead of the voltage measurement unit 30, and a change in the resistance due to the magnetoresistance effect may be measured by a change in current value.

What is claimed is:

1. A magnetoresistance effect element comprising:
   a semiconductor layer; and
   a first ferromagnetic layer and a second ferromagnetic layer provided on an upper surface of the semiconductor layer to be spaced apart from each other in a first direction,
   wherein the semiconductor layer has a first region, a second region and a third region each of which includes a part of the upper surface of the semiconductor layer and a part of a lower surface of the semiconductor layer and contains the same semiconductor material as a base material,
   the first ferromagnetic layer is provided on the first region, the second ferromagnetic layer is provided on the second region,
   the third region is sandwiched between the first region and the second region in the first direction,
   the third region has n-type conductivity,
   crystal orientations of the semiconductor material in the first direction are substantially the same in the first region, the second region, and the third region, and
   an interatomic distance of the third region in the crystal orientation of the semiconductor material in the first direction in an upper surface neighboring region including the upper surface is larger than an interatomic distance of the third region in the crystal orientation of the semiconductor material in the first direction in a lower surface neighboring region including the lower surface.

2. The magnetoresistance effect element according to claim 1,
   wherein an interatomic distance of the first region in the crystal orientation of the semiconductor material in the first direction in an upper surface neighboring region including the upper surface is larger than the interatomic distance of the third region in the crystal orientation of the semiconductor material in the first direction in the upper surface neighboring region.

3. The magnetoresistance effect element according to claim 1,
   wherein the third region of the upper surface neighboring region has a first end region in an orthogonal direction orthogonal to the first direction and a first central region in the orthogonal direction, and
   an interatomic distance of the first end region in the crystal orientation of the semiconductor material in the first direction is larger than an interatomic distance of the first central region in the crystal orientation of the semiconductor material in the first direction.

4. The magnetoresistance effect element according to claim 1, further comprising:
   a reference electrode provided on the upper surface of the semiconductor layer to be spaced apart from the first ferromagnetic layer and the second ferromagnetic layer,
   wherein the semiconductor layer has a fourth region and a fifth region each of which includes a part of the upper surface of the semiconductor layer and a part of the lower surface of the semiconductor layer and contains the semiconductor material as a base material,
   the reference electrode is provided on the fourth region,
   the fifth region is sandwiched between the second region and the fourth region in a second direction,
   the fifth region has n-type conductivity,
   crystal orientations of the semiconductor material in the second direction are substantially the same in the second region, the fourth region, and the fifth region, and
   an interatomic distance of the fifth region in the crystal orientation of the semiconductor material in the second direction in an upper surface neighboring region including the upper surface is larger than an interatomic distance of the fifth region in the crystal orientation of the semiconductor material in the second direction in an lower surface neighboring region including the lower surface.

5. The magnetoresistance effect element according to claim 4,
   wherein an interatomic distance of the fourth region in the crystal orientation of the semiconductor material in the second direction in an upper surface neighboring region including the upper surface is larger than the interatomic distance of the fifth region in the crystal orientation of the semiconductor material in the second direction in the upper surface neighboring region.

6. The magnetoresistance effect element according to claim 4,
   wherein the fifth region of the upper surface neighboring region has a second end region in an orthogonal direction orthogonal to the second direction and a second central region in the orthogonal direction, and
   an interatomic distance of the second end region in the crystal orientation of the semiconductor material in the second direction is larger than an interatomic distance of the second central region in the crystal orientation of the semiconductor material in the second direction.

7. The magnetoresistance effect element according to claim 1, further comprising:
   a first protective film provided to cover at least the upper surface of the third region,
   wherein the first protective film imparts tensile strain to the third region along the first direction.

8. The magnetoresistance effect element according to claim 1, further comprising:
   a second protective film provided to cover an end portion of the first region on a side opposite to the third region in the first direction,
   wherein the second protective film imparts tensile strain to the first region and the third region along the first direction.

9. The magnetoresistance effect element according to claim 1,
   wherein the semiconductor material has a cubic or pseudo-cubic crystal structure, and
   the crystal orientations of the semiconductor material in the first direction are substantially [110] in the first region, the second region, and the third region.

10. A carrier control type magnetoresistance effect element comprising:
    the magnetoresistance effect element according to claim 1;
    an insulating layer provided on the third region; and an electrode provided on the third region with the insulating layer therebetween and provided to be spaced apart from the first ferromagnetic layer and the second ferromagnetic layer.

11. A magnetic sensor comprising the magnetoresistance effect element according to claim 1.

12. A spin transistor comprising:
the magnetoresistance effect element according to claim 1;
an insulating layer provided on the third region; and
an electrode provided on the third region with the insulating layer therebetween and provided to be spaced apart from the first ferromagnetic layer and the second ferromagnetic layer,
wherein the first region and the second region have the same conductivity type as the third region, and
the electrode serves as a gate electrode, and one of the first ferromagnetic layer and the second ferromagnetic layer serves as a source electrode, and the other one of the first ferromagnetic layer and the second ferromagnetic layer serves as a drain electrode.

13. A magnetoresistance effect element comprising:
a semiconductor layer; and
a first ferromagnetic layer and a second ferromagnetic layer provided on an upper surface of the semiconductor layer to be spaced apart from each other in a first direction,
wherein the semiconductor layer has a first region, a second region and a third region each of which includes a part of the upper surface of the semiconductor layer and a part of a lower surface of the semiconductor layer and contains the same semiconductor material as a base material,
the first ferromagnetic layer is provided on the first region,
the second ferromagnetic layer is provided on the second region,
the third region is sandwiched between the first region and the second region in the first direction,
the third region has p-type conductivity,
crystal orientations of the semiconductor material in the first direction are substantially the same in the first region, the second region, and the third region, and
an interatomic distance of the third region in the crystal orientation of the semiconductor material in the first direction in an upper surface neighboring region including the upper surface is smaller than an interatomic distance of the third region in the crystal orientation of the semiconductor material in the first direction in a lower surface neighboring region including the lower surface.

14. The magnetoresistance effect element according to claim 13,
wherein an interatomic distance of the first region in the crystal orientation of the semiconductor material in the first direction in an upper surface neighboring region including the upper surface is smaller than the interatomic distance of the third region in the crystal orientation of the semiconductor material in the first direction in the upper surface neighboring region.

15. The magnetoresistance effect element according to claim 13,
wherein the third region of the upper surface neighboring region has a first end region in an orthogonal direction orthogonal to the first direction and a first central region in the orthogonal direction, and
an interatomic distance of the first end region in the crystal orientation of the semiconductor material in the first direction is smaller than an interatomic distance of the first central region in the crystal orientation of the semiconductor material in the first direction.

16. The magnetoresistance effect element according to claim 13, further comprising:
a reference electrode provided on the upper surface of the semiconductor layer to be spaced apart from the first ferromagnetic layer and the second ferromagnetic layer,
wherein the semiconductor layer has a fourth region and a fifth region each of which includes a part of the upper surface of the semiconductor layer and a part of the lower surface of the semiconductor layer and contains the semiconductor material as a base material,
the reference electrode is provided on the fourth region,
the fifth region is sandwiched between the second region and the fourth region in a second direction,
the fifth region has p-type conductivity,
crystal orientations of the semiconductor material in the second direction are substantially the same in the second region, the fourth region, and the fifth region, and
an interatomic distance of the fifth region in the crystal orientation of the semiconductor material in the second direction in an upper surface neighboring region including the upper surface is smaller than an interatomic distance of the fifth region in the crystal orientation of the semiconductor material in the second direction in an lower surface neighboring region including the lower surface.

17. The magnetoresistance effect element according to claim 16,
wherein an interatomic distance of the fourth region in the crystal orientation of the semiconductor material in the second direction in an upper surface neighboring region including the upper surface is smaller than the interatomic distance of the fifth region in the crystal orientation of the semiconductor material in the second direction in the upper surface neighboring region.

18. The magnetoresistance effect element according to claim 16,
wherein the fifth region of the upper surface neighboring region has a second end region in an orthogonal direction orthogonal to the second direction and a second central region in the orthogonal direction, and
an interatomic distance of the second end region in the crystal orientation of the semiconductor material in the second direction is smaller than an interatomic distance of the second central region in the crystal orientation of the semiconductor material in the second direction.

19. The magnetoresistance effect element according to claim 13, further comprising:
a first protective film provided to cover at least the upper surface of the third region,
wherein the first protective film imparts compressive strain to the third region along the first direction.

20. The magnetoresistance effect element according to claim 13, further comprising:
a second protective film provided to cover an end portion of the first region on a side opposite to the third region in the first direction,
wherein the second protective film imparts compressive strain to the first region and the third region along the first direction.

21. The magnetoresistance effect element according to claim 13, wherein the semiconductor material has a cubic or pseudo-cubic crystal structure, and the crystal orientations of the semiconductor material in the first direction are substantially [110] in the first region, the second region, and the third region.

22. A carrier control type magnetoresistance effect element comprising:

the magnetoresistance effect element according to claim 13;

an insulating layer provided on the third region; and an electrode provided on the third region with the insulating layer therebetween and provided to be spaced apart from the first ferromagnetic layer and the second ferromagnetic layer.

23. A magnetic sensor comprising the magnetoresistance effect element according to claim 13.

24. A spin transistor comprising:

the magnetoresistance effect element according to claim 13;

an insulating layer provided on the third region; and an electrode provided on the third region with the insulating layer therebetween and provided to be spaced apart from the first ferromagnetic layer and the second ferromagnetic layer, wherein the first region and the second region have the same conductivity type as the third region, and the electrode serves as a gate electrode, and one of the first ferromagnetic layer and the second ferromagnetic layer serves as a source electrode, and the other one of the first ferromagnetic layer and the second ferromagnetic layer serves as a drain electrode.

25. A spin transistor comprising:

a magnetoresistance effect element including a semiconductor layer, and a first ferromagnetic layer and a second ferromagnetic layer provided on an upper surface of the semiconductor layer to be spaced apart from each other in a first direction, wherein the semiconductor layer has a first region, a second region and a third region each of which includes a part of the upper surface of the semiconductor layer and a part of a lower surface of the semiconductor layer and contains the same semiconductor material as a base material, the first ferromagnetic layer is provided on the first region, the second ferromagnetic layer is provided on the second region, the third region is sandwiched between the first region and the second region in the first direction, crystal orientations of the semiconductor material in the first direction are substantially the same in the first region, the second region, and the third region, and an interatomic distance of the third region in the crystal orientation of the semiconductor material in the first direction in an upper surface neighboring region including the upper surface is larger than an interatomic distance of the third region in the crystal orientation of the semiconductor material in the first direction in a lower surface neighboring region including the lower surface;

an insulating layer provided on the third region; and an electrode provided on the third region with the insulating layer therebetween and provided to be spaced apart from the first ferromagnetic layer and the second ferromagnetic layer, wherein the first region and the second region have n-type conductivity, the electrode serves as a gate electrode, one of the first ferromagnetic layer and the second ferromagnetic layer serves as a source electrode, and the other one of the first ferromagnetic layer and the second ferromagnetic layer serves as a drain electrode, the third region has p-type conductivity when no voltage is applied to the gate electrode, and the gate electrode is configured to be capable of applying a voltage so that an inversion layer having n-type conductivity is formed in at least a part of the upper surface neighboring region of the third region.

26. A spin transistor comprising:

a magnetoresistance effect element including a semiconductor layer, and a first ferromagnetic layer and a second ferromagnetic layer provided on an upper surface of the semiconductor layer to be spaced apart from each other in a first direction, wherein the semiconductor layer has a first region, a second region and a third region each of which includes a part of the upper surface of the semiconductor layer and a part of a lower surface of the semiconductor layer and contains the same semiconductor material as a base material, the first ferromagnetic layer is provided on the first region, the second ferromagnetic layer is provided on the second region, the third region is sandwiched between the first region and the second region in the first direction, crystal orientations of the semiconductor material in the first direction are substantially the same in the first region, the second region, and the third region, and an interatomic distance of the third region in the crystal orientation of the semiconductor material in the first direction in an upper surface neighboring region including the upper surface is smaller than an interatomic distance of the third region in the crystal orientation of the semiconductor material in the first direction in a lower surface neighboring region including the lower surface;

an insulating layer provided on the third region; and an electrode provided on the third region with the insulating layer therebetween and provided to be spaced apart from the first ferromagnetic layer and the second ferromagnetic layer, wherein the first region and the second region have p-type conductivity, the electrode serves as a gate electrode, one of the first ferromagnetic layer and the second ferromagnetic layer serves as a source electrode, and the other one of the first ferromagnetic layer and the second ferromagnetic layer serves as a drain electrode, the third region has n-type conductivity when no voltage is applied to the gate electrode, and the gate electrode is configured to be capable of applying a voltage so that an inversion layer having p-type conductivity is formed in at least a part of the upper surface neighboring region of the third region.

* * * * *